US009140769B2

(12) United States Patent
van Zijl et al.

(10) Patent No.: US 9,140,769 B2
(45) Date of Patent: Sep. 22, 2015

(54) MAGNETIC RESONANCE IMAGING AND SPECTROSCOPY OF LOW CONCENTRATION SOLUTES WITH EXCHANGEABLE PROTONS USING LABEL TRANSFER MODULES: FREQUENCY TRANSFER, INVERSION TRANSFER, AND DEPHASING TRANSFER

(75) Inventors: Peter van Zijl, Ellicott City, MD (US); Josh Friedman, Baltimore, MD (US)

(73) Assignee: The Johns Hopkins University, Baltimore, MD (US)

(*) Notice: Subject to any disclaimer, the term of this patent is extended or adjusted under 35 U.S.C. 154(b) by 805 days.

(21) Appl. No.: 13/509,085

(22) PCT Filed: Aug. 10, 2010

(86) PCT No.: PCT/US2010/045054
§ 371 (c)(1),
(2), (4) Date: Aug. 1, 2012

(87) PCT Pub. No.: WO2011/059543
PCT Pub. Date: May 19, 2011

(65) Prior Publication Data
US 2012/0289818 A1    Nov. 15, 2012

Related U.S. Application Data

(60) Provisional application No. 61/259,799, filed on Nov. 10, 2009.

(51) Int. Cl.
*G01R 33/56* (2006.01)

(52) U.S. Cl.
CPC .................................. *G01R 33/5601* (2013.01)

(58) Field of Classification Search
CPC .................................................... G01R 33/5601
See application file for complete search history.

(56) References Cited

U.S. PATENT DOCUMENTS 6,661,226 B1 * 12/2003 Hou et al. ...................... 324/303

6,690,167 B2 * 2/2004 Reiderman et al. ........... 324/314
(Continued)

FOREIGN PATENT DOCUMENTS

JP          07327954 A    12/1995
JP       2000093402 A     4/2000
JP       2003500133 A     1/2003

*Primary Examiner* — Dixomara Vargas
(74) *Attorney, Agent, or Firm* — Johns Hopkins Technology Ventures

(57) ABSTRACT

An embodiment of the current invention provides a method for magnetic resonance (MR) imaging or spectroscopy, comprising: (a) selectively exciting exchangeable solute protons or protons of exchangeable solute-based water molecules within a frequency range in a subject using at least one frequency-selective radio frequency (RF) pulse, wherein the frequency range encompasses characteristic resonance frequencies of the exchangeable solute protons or protons of exchangeable solute-based water molecules, wherein the frequency range is substantially non-overlapping with a characteristic resonance frequency of bulk water protons in the subject, wherein the at least one frequency selective RF pulse performs a substantially minimal excitation on the bulk water protons, and wherein the at least one frequency-selective RF pulse, sometimes in combination with a time period that separates the at least one frequency-selective RF pulse, magnetically labels the exchangeable solute protons or the exchangeable solute-based water molecules; (b) allowing a portion of the magnetically labeled exchangeable solute protons to exchange with the bulk water protons or allowing the magnetically labeled exchangeable solute-based water molecules to exchange with bulk water molecules; (c) repeating (a) and (b) a plurality of times to enhance a population size of the magnetically labeled exchangeable solute protons or the magnetically labeled exchangeable solute-based water molecules; (d) irradiating the subject under observation with a water excitation RF pulse that is adapted to excite the bulk water protons; (e) recording a magnetic resonance (MR) signal from the subject under observation in response to the water excitation RF pulse; and (f) analyzing the recorded MR signal to estimate a quantity associated with the exchangeable solute protons or the exchangeable solute-based water molecules.

25 Claims, 30 Drawing Sheets

(56) References Cited

U.S. PATENT DOCUMENTS

| | | | |
|---|---|---|---|
| 8,193,811 B2* | 6/2012 | Tropp et al. | 324/318 |
| 8,278,925 B2* | 10/2012 | Sun et al. | 324/308 |
| 2003/0220559 A1* | 11/2003 | Ehnholm et al. | 600/410 |
| 2012/0286781 A1* | 11/2012 | van Zijl et al. | 324/309 |

* cited by examiner

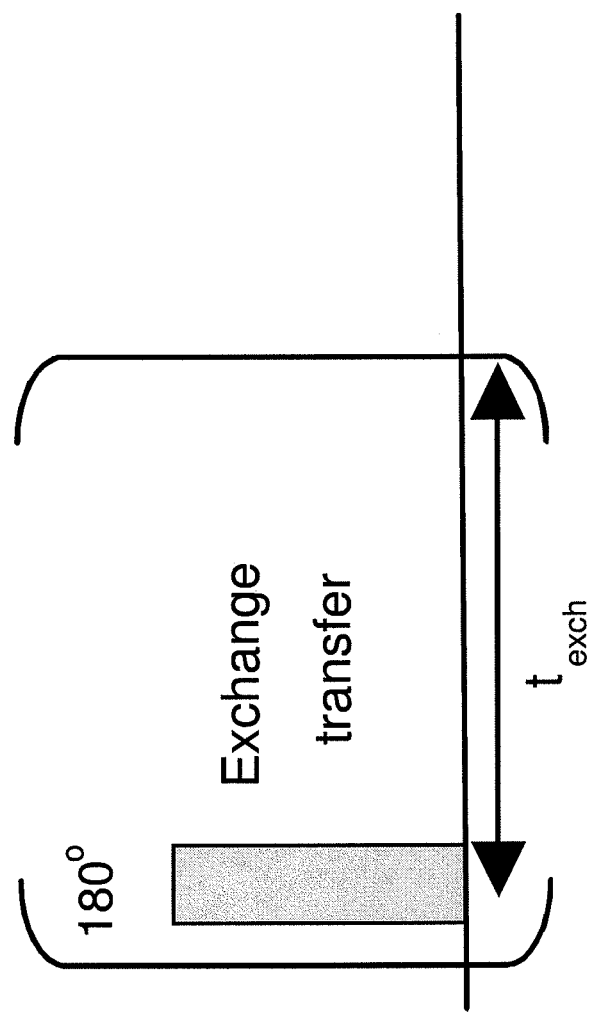

| Experiment | $a1$ | $t_{evol}$ | $a2$ | G | $t_{exch}$ | A | B | C |
|---|---|---|---|---|---|---|---|---|
| (a) inversion | 180 | 0 | 0 | 0 | $t_{prep}/n - pw$ | 2 | 1 | 1 |
| (b) dephase | 90 | 0 | 0 | G | $\gg (t_{prep}/n - pw)$ | 1 | $e^{-(k+R_{2s}^*)t_{evol}}$ | 1 |
| (c) Frequen. Modulate | 90 | $t_{evol}$ | -90 | 0 | $t_{prep}/n - t_{evol} - 2pw$ | 1 | $e^{-(k+R_{2s}^*)t_{evol}}$ | $\cos(\alpha t_{evol})$ |

FIG. 11B

|  | Freq (ppm) | $k_s$ (s$^{-1}$) | $\beta_s$ | $\lambda_s$ | $[H]_s$ (mM) |
|---|---|---|---|---|---|
| 5-FU | 14.38 | 209 | 0.82 | 0.58 | 1.2 |
| T2 | 14.16 | 81 | 0.49 | 0.56 | 1.3 |
| G10 | 13.14 | 304 | 0.92 | 0.45 | 1.2 |

FIG. 13C

MAGNETIC RESONANCE IMAGING AND SPECTROSCOPY OF LOW CONCENTRATION SOLUTES WITH EXCHANGEABLE PROTONS USING LABEL TRANSFER MODULES: FREQUENCY TRANSFER, INVERSION TRANSFER, AND DEPHASING TRANSFER

The U.S. Government has a paid-up license in this invention and the right in limited circumstances to require the patent owner to license others on reasonable terms as provided for by the terms of Grants No. 5R01GM056834 and 5KO1EB006394 awarded by the National Institute of Health.

CROSS-REFERENCE TO RELATED APPLICATIONS

This application is a 35 U.S.C. §371 U.S. national entry of International Application PCT/US2010/045054 having an international filing date of Nov. 10, 2010, which claims the benefit of U.S. Provisional Application No. 61/259,799, filed Nov. 10, 2009, the content of each of the aforementioned applications is herein incorporated by reference in their entirety.

BACKGROUND

1. Field of Invention

The current invention relates to methods for magnetic resonance imaging and spectroscopy. More specifically the field relates to methods for the indirect detection of exchangeable solute protons or protons of exchangeable solute-based water molecules through the water signal that can be used for MRI and to the detection of low-concentration solutes, both exogenous (e.g., contrast agents) and endogenous (e.g., cellular constituents).

2. Discussion of Related Art

Although magnetic resonance imaging (MRI) is an established imaging modality, due to inherent limitations in sensitivity, MRI is at great disadvantage to optical and radioactive methods in detecting low concentration of contrast agents. To make matters worse, most of the (super)para-magnetic metals used to enhance relaxation are toxic when not chelated, the only current exception being iron. This limitation of exogenous MRI contrast to relaxation agents was the status quo until 2000, when Ward and Balaban suggested using exchangeable protons for MRI contrast. This suggestion opened up a new range of possible contrast agents and the possibility to turn contrast on and off by using RF saturation. In fact, based on this procedure of chemical exchange saturation transfer (CEST), the new range of contrast agents have been named CEST agents (Ward, K. M., Aletras, A. H. & Balaban, R. S. A new class of contrast agents for MRI based on proton chemical exchange dependent saturation transfer (CEST). *J Magn Reson* 143, 79-87 (2000); Ward, K. M. & Balaban, R. S. Determination of pH using water protons and chemical exchange dependent saturation transfer (CEST). *Magn Reson Med* 44, 799-802 (2000)) as well as U.S. Pat. No. 6,963,769. This chemical exchange saturation transfer may enable large sensitivity enhancements, leading to the detection of CEST contrast agents at low concentrations (μM or even lower) while maintaining the ability to see changes on a 110M water signal (Zhou, J. & van Zijl, P. Chemical exchange saturation transfer imaging and spectroscopy. PROGR. IN NMR SPECTR 48, 109-136 (2006); Sherry, A. D. & Woods, M. Chemical exchange saturation transfer contrast agents for magnetic resonance imaging. Annual review of biomedical engineering 10, 391-411 (2008); De Leon-Rodriguez L M, Lubag A J, Malloy C R, Martinez G V, Gillies R J, Sherry A D. Responsive MRI agents for sensing metabolism in vivo. Acc Chem Res. 21; 42(7):948-57 (2009). Viswanathan S, Kovacs Z, Green K N, Ratnakar S J, Sherry A D. Alternatives to gadolinium-based metal chelates for magnetic resonance imaging. Chem Rev. 12; 110(5):2960-3018 (2010); Aime, S., Delli Castelli, D. & Terreno, E. Highly sensitive MRI chemical exchange saturation transfer agents using liposomes. *Angewandte Chemie (International ed* 44, 5513-5515 (2005)). Terreno E, Castelli D D, Aime S. Encoding the frequency dependence in MRI contrast media: the emerging class of CEST agents. Contrast Media Mol Imaging. 5(2):78-98 (2010); Terreno E, Castelli D D, Aime S. Challenges for Molecular Magnetic Resonance Imaging, Chem. Rev. 110, 3019-3042 (2010). In addition, several endogenous molecules, including certain protein and peptide fragments (Zhou, J., Lal, B., Wilson, D. A., Laterra, J. & van Zijl, P. C. Amide proton transfer (APT) contrast for imaging of brain tumors. *Magn Reson Med* 50, 1120-1126 (2003); Zhou, J., Payen, J. F., Wilson, D. A., Traystman, R. J. & van Zijl, P. C. Using the amide proton signals of intracellular proteins and peptides to detect pH effects in MRI. *Nat Med* 9, 1085-1090 (2003) and U.S. Pat. No. 6,943,033) as well as sugars (U.S. Pat. No. 7,683,617 and van Zijl P C, Jones C K, Ren J, Malloy C R, Sherry A D. MRI detection of glycogen in vivo by using chemical exchange saturation transfer imaging (glycoCEST). Proc Natl Acad Sci USA. 2007 Mar. 13; 104(11):4359-64) and many related compounds (e.g. Ling W, Regatte R R, Navon G, Jerschow A, Assessment of glycosaminoglycan concentration in vivo by chemical exchange-dependent saturation transfer (gagCEST). Proc Natl Acad Sci USA. 19; 105(7): 2266-70 (2008)) can be detected using chemical exchange saturation transfer imaging approaches. There is a large effort for the development of new noninvasive CEST agents for cell labeling and other applications for generating contrast. In addition, several important endogenous substrates and other compounds important for tissue metabolism and function in vivo contain such exchangeable protons, which can be used to diagnose cancer and stroke and potentially other diseases. Currently, radio-frequency (RF) based saturation transfer using either a long low-power RF pulse (Ward, K. M., Aletras, A. H. & Balaban, R. S. A new class of contrast agents for MRI based on proton chemical exchange dependent saturation transfer (CEST). *J Magn Reson* 143, 79-87 (2000)) or a series of higher power shorter RF pulses (Zhou, J., Lal, B., Wilson, D. A., Laterra, J. & van Zijl, P. C. Amide proton transfer (APT) contrast for imaging of brain tumors. *Magn Reson Med* 50, 1120-1126 (2003)) is the only available approach to image such CEST compounds. There are several disadvantages for RF saturation, including the need to separately saturate different protons when they occur at different MR frequencies and the need for reference scans to control for the effects of interfering direct water saturation and tissue magnetization transfer effects. Thus, there is a need in the art for improved methods and systems for detecting low concentrations of solute having protons that exchange with water protons.

SUMMARY

An embodiment of the current invention provides a method for magnetic resonance (MR) imaging or spectroscopy, comprising: (a) selectively exciting exchangeable solute protons or protons of exchangeable solute-based water molecules in a subject using at least one frequency-selective radio frequency (RF) pulse, wherein the at least one frequency-selective RF pulse has a corresponding frequency response covering a frequency range, wherein the frequency range encompasses characteristic resonance frequencies of the exchangeable solute protons, wherein the frequency range is located away from a characteristic resonance frequency of water protons in the subject by an offset frequency, wherein the frequency response of the at least one frequency-selective RF pulse has a substantially minimal frequency component at the characteristic resonance frequency of the water protons, and wherein the at least one frequency-selective RF pulse magnetically labels the exchangeable solute protons; (b) allowing a portion of the magnetically labeled exchangeable solute protons to exchange with the water protons; (c) repeating (a) and (b) a plurality of times to enhance a population size of the magnetically labeled exchangeable solute protons (d) irradiating the subject under observation with a RF excitation pulse having a corresponding frequency response encompassing the characteristic resonance frequency of the water protons; (e) recording a magnetic resonance (MR) signal from the subject under observation in response to the RF excitation pulse; and (f) analyzing the recorded MR signal to estimate a quantity associated with the exchangeable solute protons.

Another embodiment of the current invention provides an magnetic resonance imaging (MRI) system, comprising: a magnet constructed to provide a substantially uniform main magnetic field for a subject under observation; a radio frequency (RF) coil system constructed to selectively excite exchangeable solute protons or protons of exchangeable solute-based water molecules with in a frequency range in said subject using at least one frequency-selective radio frequency (RF) pulse, wherein said frequency range encompasses characteristic resonance frequencies of the exchangeable solute protons or protons of exchangeable solute-based water molecules, wherein said frequency range is substantially non-overlapping with a characteristic resonance frequency of bulk water protons in said subject, wherein said at least one frequency-selective RF pulse performs a substantially minimal excitation on said bulk water protons, and wherein said at least one frequency-selective RF pulse, in combination with a time period that separates said at least one frequency-selective RF pulse, magnetically labels said exchangeable solute protons or said exchangeable solute-based water molecules; irradiate said subject under observation with a water excitation RF pulse to excite said bulk water protons; record a magnetic resonance (MR) signal from said subject under observation in response to said bulk water excitation RF pulse; and a signal processing unit, in communication with said RF coil system, configured to analyze the recorded MR signal to estimate a quantity associated with said exchangeable solute protons or protons of exchangeable solute-based water molecules.

BRIEF DESCRIPTION OF THE DRAWINGS

Further objectives and advantages will become apparent from a consideration of the description, drawings, and examples.

FIG. 6A is a schematic illustration of a selective inversion pulse as a label-transfer module (LTM) according to some embodiments of the current invention (inversion labeling).

FIG. 11B shows a compilation of the experimental and theoretical parameters for three LTM sequences (inversion, dephasing, and frequency labeling) according to some embodiments of the current invention.

FIG. 13C is table of the measured frequency shift, exchange rate, exchange efficiency, labeling efficiency, and concentration for three imino protons.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Some embodiments of the current invention provide a group of magnetic resonance imaging (MRI) methodologies or processes for detecting one or more exchangeable protons or protons of exchangeable solute-based water molecules in exogenous or endogenous agents via the water signal without the need to use radiofrequency (RF) saturation. Currently, all of these compounds are being detected using an MR method called radio frequency (RF) saturation transfer. The present invention does not employ RF saturation transfer, but instead uses a process of selective serial labeling of one or more exchangeable protons and consecutive transfer of these protons to water to achieve a large sensitivity enhancement (e.g., several orders of magnitude) with respect to standard MR. This label-transfer-module (LTM) based approach allows the use of several novel types of exchange labeling for MRI, including frequency transfer, inversion transfer, and dephasing transfer. The LTM approach has the capability of exchange rate filtering, providing the potential to separate the agent signals from background signals due to direct water saturation or due to interfering slower magnetization transfer effects. In the frequency transfer approach, enhancement and indirect detection of exchangeable solute protons (e.g., multiple protons in one compound, protons of multiple compounds) or protons of exchangeable solute-based molecules (e.g., protons in water molecules coordinated to a complex and frequency shifted with respect to water, or coordinated water molecules or other exchangeable molecules containing exchangeable protons) through the water signal at one characteristic resonance frequency can be done while preserving specific frequency information of the exchangeable solute protons (from, e.g., multiple compounds). Thus the information of multiple solute proton species can be imaged specifically and simultaneously.

Figure 1:
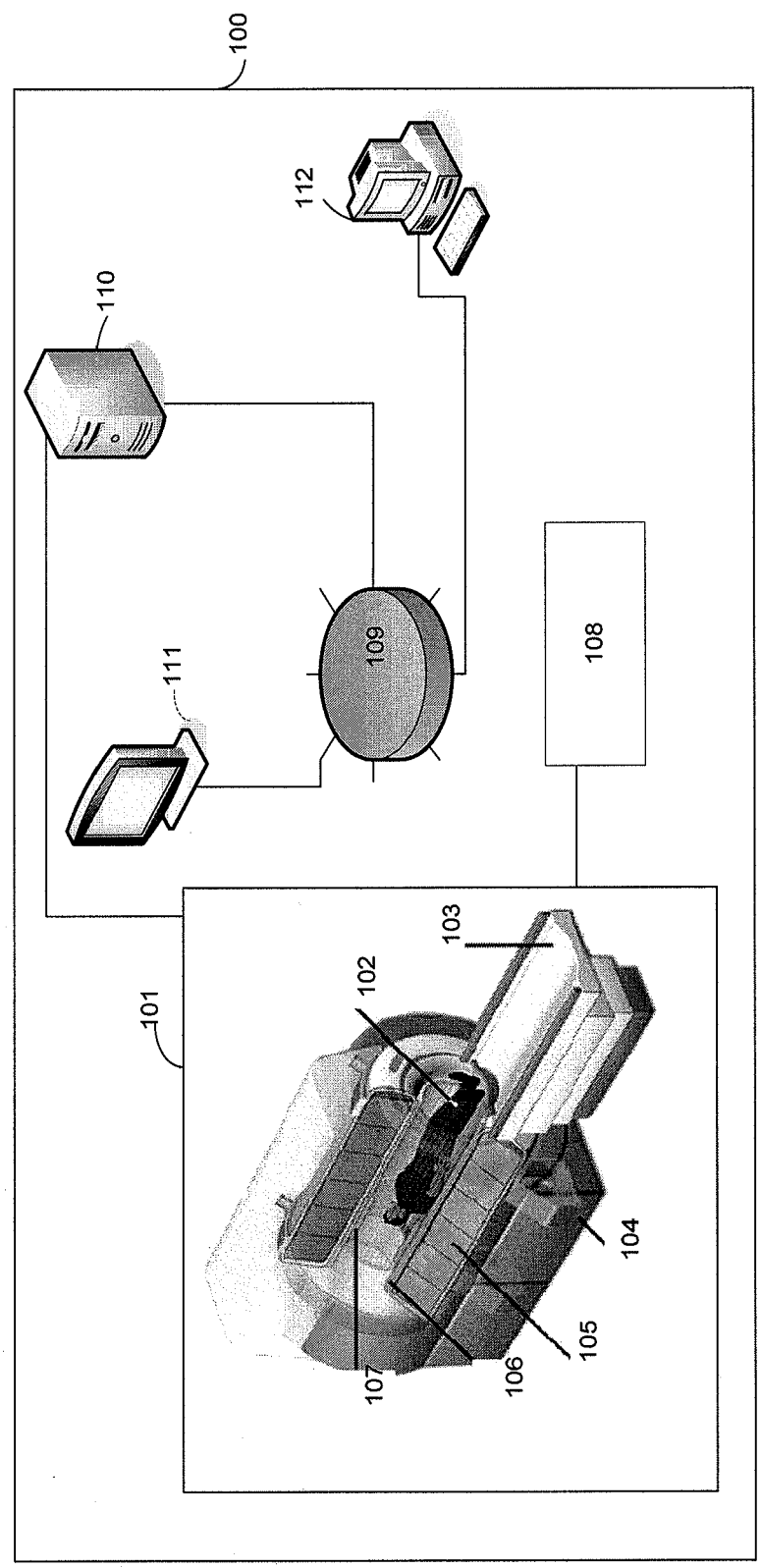
FIG. 1 is a schematic illustration of a magnetic resonance imaging system on which the embodiments of the current invention can be implemented.

FIG. 1 shows an example of a typical magnetic resonance imaging system on which the MRI methodologies according to some embodiments of the current invention can be implemented.

The MRI system 100 includes a magnetic resonance scanner 101, a data storage unit 108, and a signal processing unit 109. Magnetic resonance scanner 101 has a main magnet 105 mounted on base 104 that provides a substantially uniform main magnetic field $B_0$ for a subject 102 under observation on scanner bed 103, a gradient system 106 that provides a perturbation of the main magnetic field $B_0$ to encode spatial information of the constituent water molecules within a region of interest of subject 102 under observation, and a radio-frequency (RF) coil system 107 to transmit electromagnetic waves and to receive magnetic resonance signals from subject 102. MRI system 100 may be a human scanner or and experimental scanner for animals or phantoms containing chemicals.

Subject 102 may be one of a sample, a phantom, an animal, a human, or combinations thereof. Subject 102 may have exchangeable solute protons or protons of exchangeable solute-based water molecules with a characteristic range of resonance frequencies as well as bulk water protons (i.e., protons on bulk water molecules) having a characteristic resonance frequency. The solute protons may be contained in one or more endogenous or exogenous solute or solutes. Endogenous solutes may include compounds originated within the body of subject 102, for example, body metabolites. Exogenous solutes may include compounds originated from outside the body of subject 102, for example, contrast agents. The solute protons are less abundant than the water protons and the characteristic resonance frequency range is different from the characteristic water resonance frequency by an offset frequency.

RF coil system 107 comprises at least one radio frequency (RF) coil capable of irradiating radio frequency (RF) pulses into a region of interest of said subject under observation. The RF coil may be, for example, a surface coil, a neck coil, an extremity coil, a head coil, a body coil, a phased-array coil, a multi-channel transmit coil, etc. The RF coil may be embodied as a solenoid, a planar, a volume, a quadrature coil, or combinations thereof. The RF coil may be for transmission only or for both transmission and reception. Multiple coils for separate transmit and receive setups can be used. RF coil system 107 may further be connected to a power amplifier to amplify the RF pulse being transmitted or the received magnetic resonance signals. RF coil system 107 may further comprise matching and/or tuning networks for impedance matching and/or frequency tuning purposes.

The RF coil system 107 may irradiate one or more frequency-selective radio frequency (RF) pulses into a region of interest of the subject 102 to magnetically label the exchangeable solute protons. The region of interest, can be, for example, a brain, a heart, a muscle, a liver, a knee, a neck, etc. The one or more frequency-selective RF pulses excite a frequency range at a frequency offset different from the characteristic water resonance frequency such that any overlap with the characteristic water resonance frequency is substantially minimized.

RF coil system 107 may be further configured to irradiate a repetitive series of one or more RF pulses intermixed with delay times for evolving transverse magnetizations or for exchanging magnetically labeled solute protons.

After such a repeated series of RF pulses, the RF coil system 107 can be used to excite the characteristic water resonance frequency of subject 102. RF coil system 107 may be further configured to receive a magnetic resonance (MR) water response signal. The portion of the exchangeable solute protons that exchange with the water protons may cause a reduction of the MR water response signal.

Controller 108, in communication with RF coil system 107, may be configured to synchronously provide RF coil system 107 with the above-described RF pulses. Controller 108 may be also be in communication with gradient system 106 to further synchronously provide the gradient pulse. The controller may be housed, for example, on dedicated hardware coupled to the RF coil.

Data storage unit 109 is in communication with signal processing unit 110 to store magnetic resonance signals emitted in the form of electromagnetic radio frequency (RF) signals from the region of interest of subject 102 under observation. Data storage unit 108 may be, for example, a hard disk drive, a network area storage (NAS) device, a redundant array of independent disks (RAID), a flash drive, an optical disk, a magnetic tape, a magneto-optical disk, etc. However, the data storage unit 108 is not limited to these particular examples. It can include other existing or future developed data storage devices without departing from the scope of the current invention.

Signal processing unit 110 is in communication with magnetic resonance scanner 101 to receive magnetic resonance response signals emitted from the water protons in the region of interest of subject 102 in response to the RF excitation pulse. Signal processing unit 110 may be partially or totally incorporated within a structure housing magnetic resonance scanner 101. Signal processing unit 109 may be at least partially incorporated in a workstation that is structurally separate from and in communication with magnetic resonance scanner 101. Signal processing unit 109 may be incorporated in a workstation that is structurally separate from and in communication with magnetic resonance scanner 101. A workstation can be a general purpose computer having at least one central processing unit (CPU) and one memory, for example, static random access memory (SRAM), dynamic random access memory (DRAM), erasable programmable random access memory (EPROM), non-volatile Flash memory, etc. Signal processing unit 109 may also be a dedicated computing device such as, for example, an application-specific device, a field programmable logic array device, a digital signal processing device, or combinations thereof.

Signal processing unit 110 may process the received magnetic resonance signals from subject 102. The processing may comprise performing spatial and frequency and/or time domain analyses of the received MR response water signals in the region of interest of subject 102; and characterizing a quantity associated with the exchangeable solute protons or protons of exchangeable solute-based water molecules. The processed results may also be spectrally edited. The processed results may be used for further analysis and diagnosis.

The processed results may be presented to a human observer by an output device in communication with signal processing unit 110. For example, the processed results may be supplied to and visualized on a display device, such as, for example, viewing station 111 or a console station 112. Viewing station 111 or console station 112 may be a display device such as, for example, a cathode ray tube (CRT) monitor, a liquid crystal display (LCD) monitor, a digital light projection (DLP) monitor, a plasma screen, an organic light emitting diode (OLED), etc. For example, the processed results may be supplied to a printer such as, for example, a ink-jet printer, a thermal printer, etc. The printer may print the processed result for a human observer to review.

Figure 2:
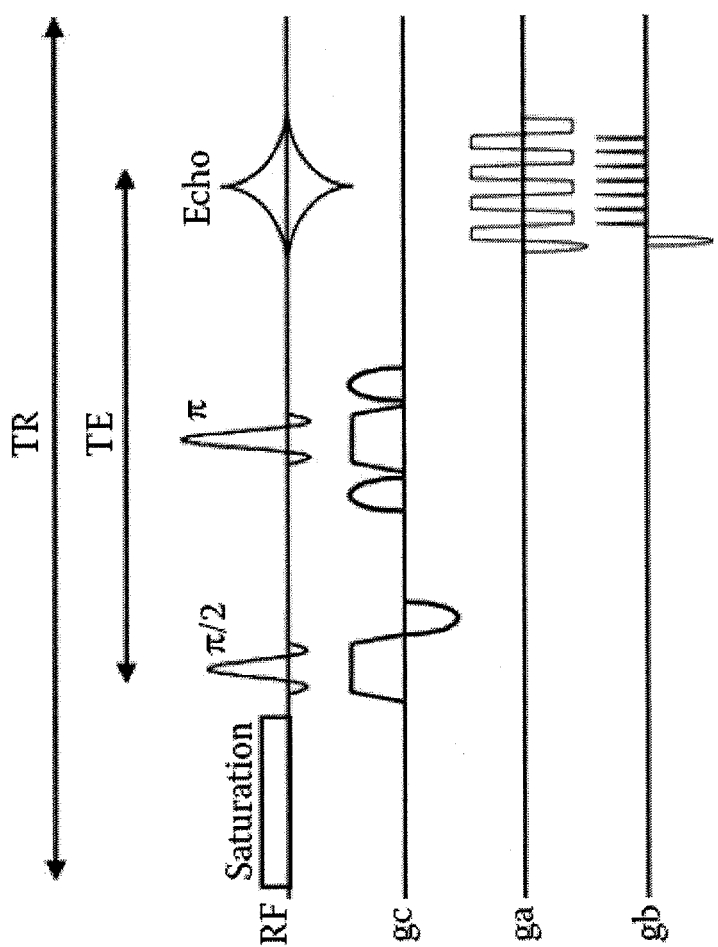
FIG. 2 shows a conventional saturation transfer imaging pulse sequence.

FIG. 2 shows a conventional saturation transfer imaging pulse sequence. A long saturation RF pulse with low RF power (or a series of shorter saturation pulses with higher RF power), may be applied as a preparation pulse. The saturation may substantially equalize spin populations in the high (i.e., anti-parallel to the main magnetic field) and low (i.e., parallel to the main magnetic field) energy states. The preparation saturation RF pulse may be irradiated for each repetition time (TR). Following the long saturation RF pulse, any multi-dimensional MR imaging or spectroscopy pulse sequence may be used for detection. As an example, a multi-slice 90°-180° RF pulse pair is shown that produces a spin-echo at the echo time (TE). The spin echo may be read out using gradient encoding pulses of ga and gb, and gradient pulse gc represent a slice selection gradient pulse applied synchronously with the 90°-180° RF pulse pair.

Figure 3A:
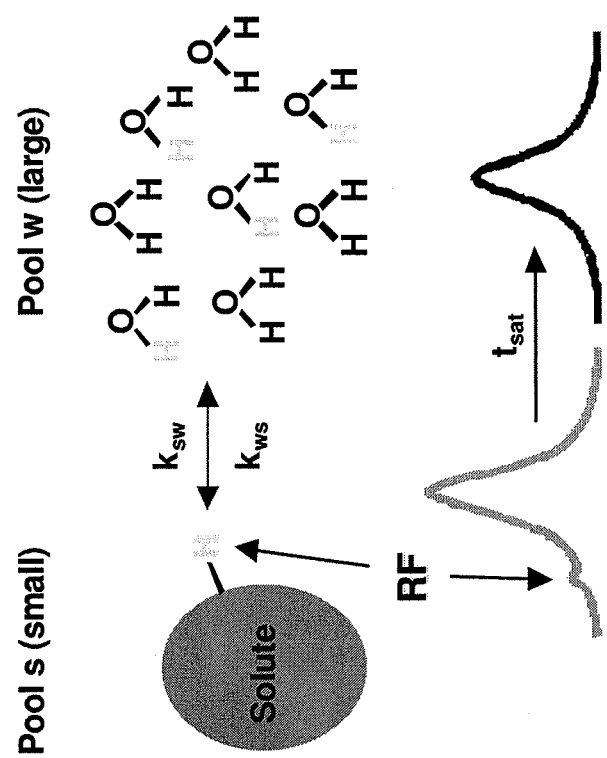
FIG. 3A illustrates the principle of chemical exchange saturation transfer (CEST) between solute protons and water protons.

FIG. 3A illustrates the principle of how the large pool of water protons and the corresponding magnetic resonance water signal may change, induced by saturation of an exchangeable proton or protons of exchangeable water molecules on a low-concentration solute with frequencies different from that of bulk water protons. The bulk water protons may have a corresponding resonance peak shown as the main peak in the lower left graph while the solute protons may have a corresponding resonance peak indicated as the small bulge on the left of this main peak. A RF pulse is applied at the resonance peak frequency of solute protons. This RF pulse may partially or completely saturate the solute protons. At first glance, the saturation may appear to affect magnetic resonance signals coming off solute protons only and not those from water protons. However, because of chemical exchange of saturated solute protons (characterized by, for example, exchange rate constant $k_{sw}$ between the solute protons and the water protons) and exchange back of non-saturated water protons (characterized by, for example, $k_{ws}$ between portions of the water protons and the solute protons), the saturation may affect magnetic resonance signals from water protons, as indicated by the dampened peak measured after $t_{sat}$, on the bottom right graph.

Figure 3B:
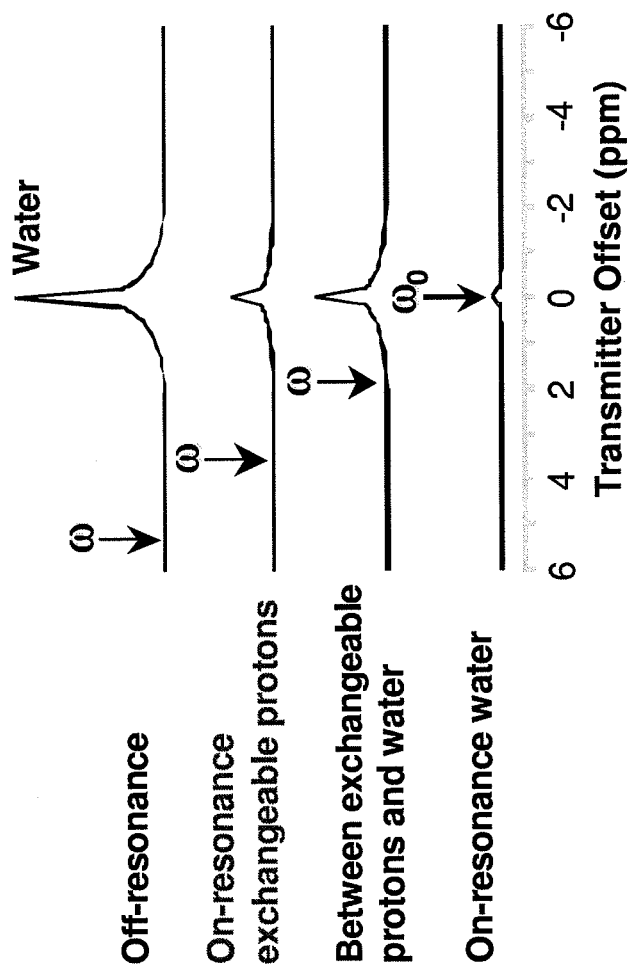
FIG. 3B illustrates the process of radio frequency (RF) saturation as a function of irradiation frequency currently used in CEST MR to generate a CEST spectrum (also called z-spectrum or magnetization transfer (MT) spectrum).

FIG. 3B illustrates how to perform a conventional CEST experiment by measuring the spectral dependence of water resonance signal resulting from the chemical exchange between solute protons and water protons. When the irradiated RF pulse is at a frequency far off-resonance from the water resonance peak, as shown in the upper most graph, the RF pulse may have little effect on the water resonance signal. However, when the irradiated RF pulse is at the frequency corresponding to the resonance frequency of exchangeable solute protons or protons of exchangeable solute-based water molecules, there may be a significant reduction of water resonance signals, as shown in the second graph. When the irradiated RF pulse is at the frequency between the resonance frequencies of solute and bulk water protons, there may be a reduction of water resonance signals, as shown in the third spectrum from the top. When the irradiated RF pulse is on the resonance frequency of bulk water, resonance signals from water may be substantially nullified, as shown in the bottom graph. This spectral dependency has been named a chemical-exchange-saturation-transfer (CEST)-spectrum, a magnetization transfer (MT) spectrum, or a z-spectrum.

Figure 3C:
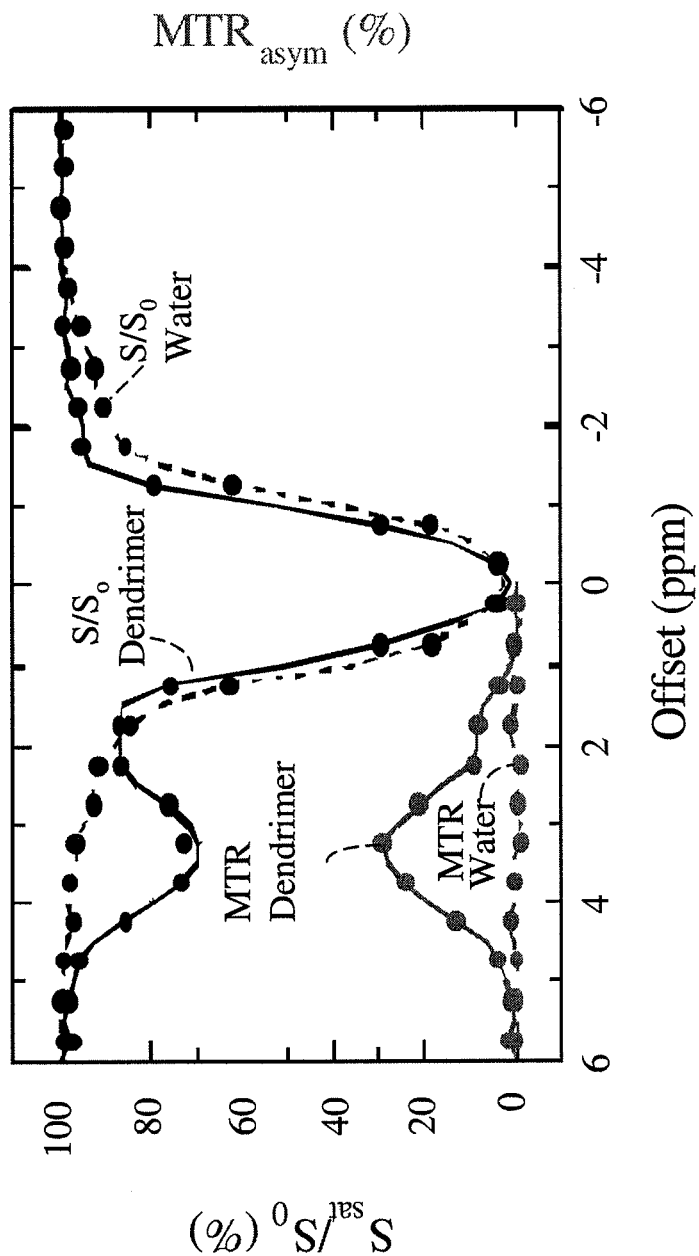
FIG. 3C shows an example of the spectral dependence of a water signal change resulting from the chemical exchange between solute protons that are labeled using a radio frequency (RF) pulse and water protons and illustrates the measured Z-spectra (plot of signal S divided by non-saturated signal $S_0$) and magnetization-transfer ratios (MTRs) of a starburst PAMAM dendrimer (solid line) and pure water (dashed line).

FIG. 3C illustrates the measured Z-spectra and magnetization transfer ratios (MTRs) resulting from CEST experiments on a solution of a starburst PAMAM dendrimer (solid lines) and pure water (dashed lines). The PAMAM dendrimer is SPD-5, with a molecular weight of 28.8 kDa, at a concentration of 1 mM and a pH of 7.3. In a z-spectrum, the water peak in the proton spectrum, is generally re-assigned to a reference frequency of 0 ppm, where negligible signal remains due to direct saturation of water protons. A sample of pure water in a solution in a phantom produces a symmetric z-spectrum (e.g., the dashed line of $S/S_0$ Water in FIG. 3C) showing only direct saturation effect, while a sample with exchangeable protons having a resonance frequency different from that of water protons may produce an asymmetric z-spectrum (e.g., solid line of $S/S_0$ Dendrimer in FIG. 3C) showing the CEST effect. To separate direct saturation and CEST effects, a magnetization transfer (MT) asymmetry analysis may be performed in which the right and left part of the z-spectrum with respect to water (0 ppm) are differentiated. This MT ratio (MTR) asymmetry may be defined as:

$$MTR_{asym}(\Delta\omega)=S_{sat}(-\Delta\omega)/S_0-S_{sat}(+\Delta\omega)/S_0. \qquad \text{Eqn. (1).}$$

Other definitions may also be used. The $MTR_{asym}$ of the PAMAM dendrimer (i.e., the solid line of MTR Dendrimer in FIG. 3C) yields a signal difference around $\Delta\omega=3.5$ ppm corresponding to the amide protons in the dendrimer. Meanwhile, the $MTR_{asym}$ for pure water (i.e., the solid line of MTR Water in FIG. 3C) is substantially flat and zero. This asymmetry analysis procedure may be very sensitive to the exact spectral location of the center resonance frequency of water protons and thus to magnetic field inhomogeneities because such inhomogeneities can shift the center water frequency around and may affect the measurement and quantification of the CEST effect. In some of the embodiments of this invention, this problem can be avoided.

In tissue, in addition to direct saturation, multiple magnetization transfer (MT) mechanisms may contribute to the CEST spectrum, further complicating measurement and quantification. Chemical exchange is a MT mechanism with a single transfer pathway. As such, CEST differs from conventional magnetization transfer contrast (MTC) arising from protons in immobile semi-solid macromolecules (such as, for example, structural proteins, membranes, and myelins) in tissue. In MTC, saturation transfer occurs in multiple steps, both through dipolar coupling and chemical exchange. Solid-like protons have a very short $T_2$ and $T_2^*$, and, therefore, resonate over a very large spectral width ($\pm 100$ kHz) that does not allow selective RF irradiation of individual resonances. In contrast, protons of CEST agent molecules resonate over a limited band near the water resonance. CEST effects are generally clearly asymmetric with respect to the water resonance frequency, while MT effects look symmetric. In some cases, this difference in symmetry may separate CEST from both MTC and direct saturation through the $MTR_{asym}$ analysis. However, MT effects are not completely symmetric, hampering the analysis of CEST effects in vivo. Thus, development of new acquisition methods may be required to facilitate separation of CEST and MTC during data analysis. CEST technology is progressing rapidly and new saturation methods (e.g. on-resonance WALTZ sequences (Vinogradov, E., He, H., Lubag, A., Balschi, J. A., Sherry, A. D. & Lenkinski, R. E. MRI detection of paramagnetic chemical exchange effects in mice kidneys in vivo. *Magn Reson Med* 58, 650-655 (2007); Vinogradov, E., Zhang, S., Lubag, A., Balschi, J. A., Sherry, A. D. & Lenkinski, R. E. On-resonance low B1 pulses for imaging of the effects of PARACEST agents. *J Magn Reson* 176, 54-63 (2005)) and saturation enhancement schemes (e.g. using intermolecular double-quantum effects (Ling, W., Eliav, U., Navon, G. & Jerschow, A. Chemical exchange saturation transfer by intermolecular double-quantum coherence. *J Magn Reson* 194, 29-32 (2008); Zhang, S., Zhu, X., Chen, Z., Cai, C., Lin, T. & Zhong, J. Improvement in the contrast of CEST MRI via intermolecular double quantum coherences. *Phys Med Biol* 53, N287-296 (2008)) may improve data analysis of CEST effects in vivo. Although CEST was discovered about ten years ago, interestingly, most existing acquisition approaches remain similar to methods previously developed for the study of MTC in that saturation labeling via saturation transfer is the only approach available.

Figure 4:
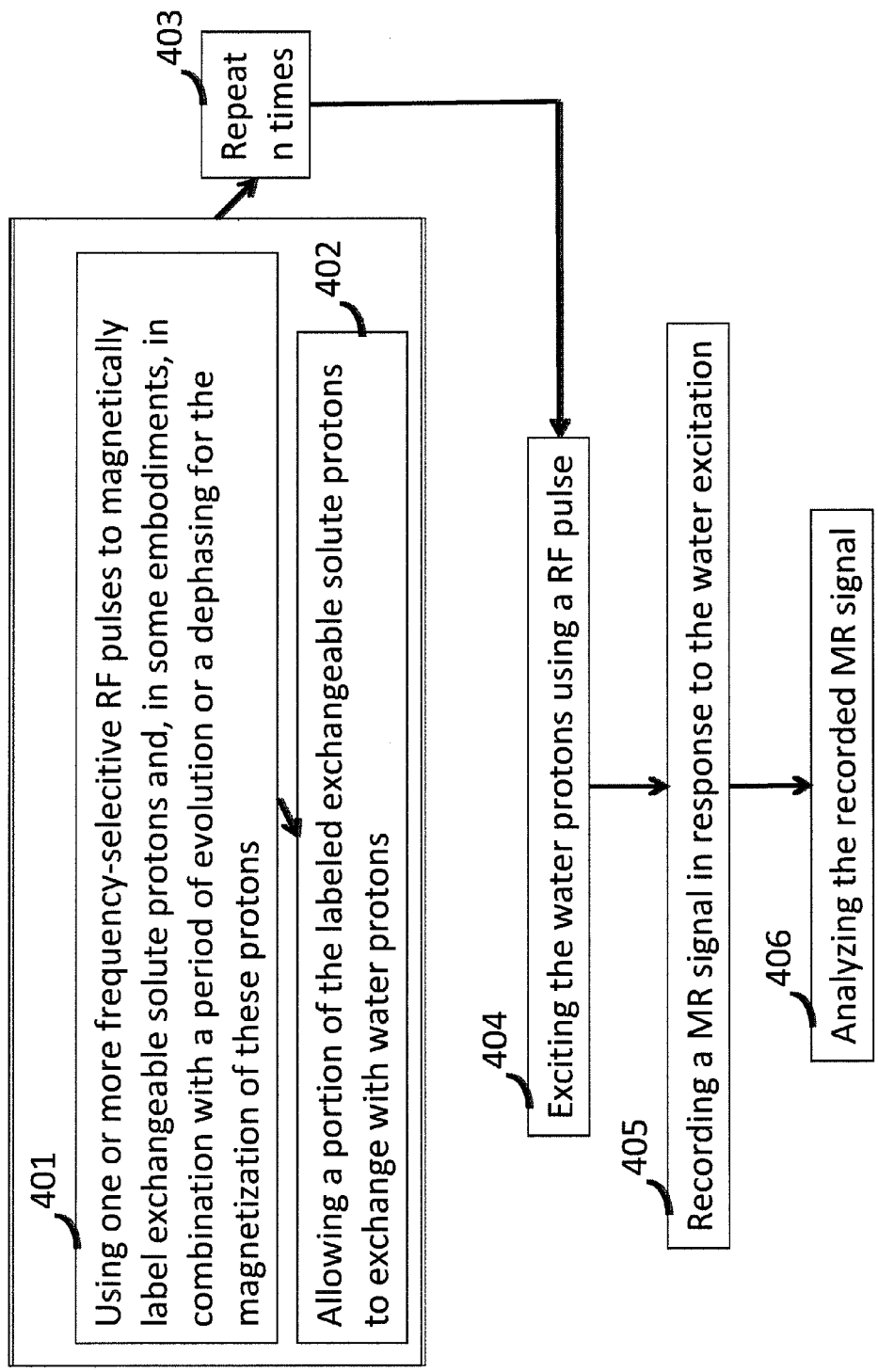
FIG. 4 is a flow-chart of a method according to some embodiments of the current invention.

FIG. 4 shows a flow-chart of a method according to some embodiments of the current invention. In block 401, one or more frequency-selective RF pulses may be applied into subject 102 in the main magnet of MRI scanner 101. The subject 102 may comprise two or more species of protons, for example, solute protons and water protons with different resonance frequencies. The solute protons may be one or more exchangeable protons from one or more compounds or protons on exchangeable water molecules coordinated to solutes or exchangeable protons on exchangeable molecules for which the molecular exchange is faster than the proton exchange rate. These solute protons may be coupled nuclei. The frequency-selective RF pulses applied to exchangeable solute protons or protons of exchangeable solute-coordinated water molecules are at a frequency offset from the bulk water resonance frequency and with substantially minimal effect in transferring longitudinal magnetization to transverse magnetization at the water resonance frequency. The frequency-selective RF pulses, in some embodiments in combination with certain time delays (e.g., an evolution time) or magnetic field gradient pulses (e.g., a dephasing gradient) between the frequency-selective RF pulses, magnetically label the solute protons. RF saturation as used by conventional CEST and MT acquisition approaches is just one type of magnetic labeling. In fact, building up saturation according to such existing acquisition approaches is quite inefficient compared to the labeling proposed here using frequency-selective RF excitation, which labels protons of interest rapidly (in microseconds or milliseconds, i.e. almost instantaneously), and with high efficiency (as will be explained below).

In block 402, the labeled solute protons are allowed to exchange with water protons. The exchange is achieved by waiting an exchange time after the final labeling RF pulse or after a dephasing gradient pulse or after an evolution period. The exchange time may be varied to adjust the portion of labeled solute protons that exchange with water protons. The combined procedures of blocks 401 (labeling) and 402 (exchange transfer) constitute a single label-transfer module (LTM)

In block 403, the LTM is repeated a plurality of times to accomplish a sensitivity enhancement that allows the detection of low-concentration solute protons, for example, within the concentration range from less than 50% of the water proton concentration, effectively including at least picomolar to molar range.

In block 404, a RF excitation pulse is applied to subject 102 with a corresponding frequency response encompassing the resonance frequency of water protons. In block 405, a magnetic resonance (MR) signal from subject 102 in response to this water detection RF pulse may be recorded. The recording may be performed on data storage unit 109. In block 406, the recorded MR signal may be analyzed to estimate a quantity associated with the solute protons.

Figure 5:
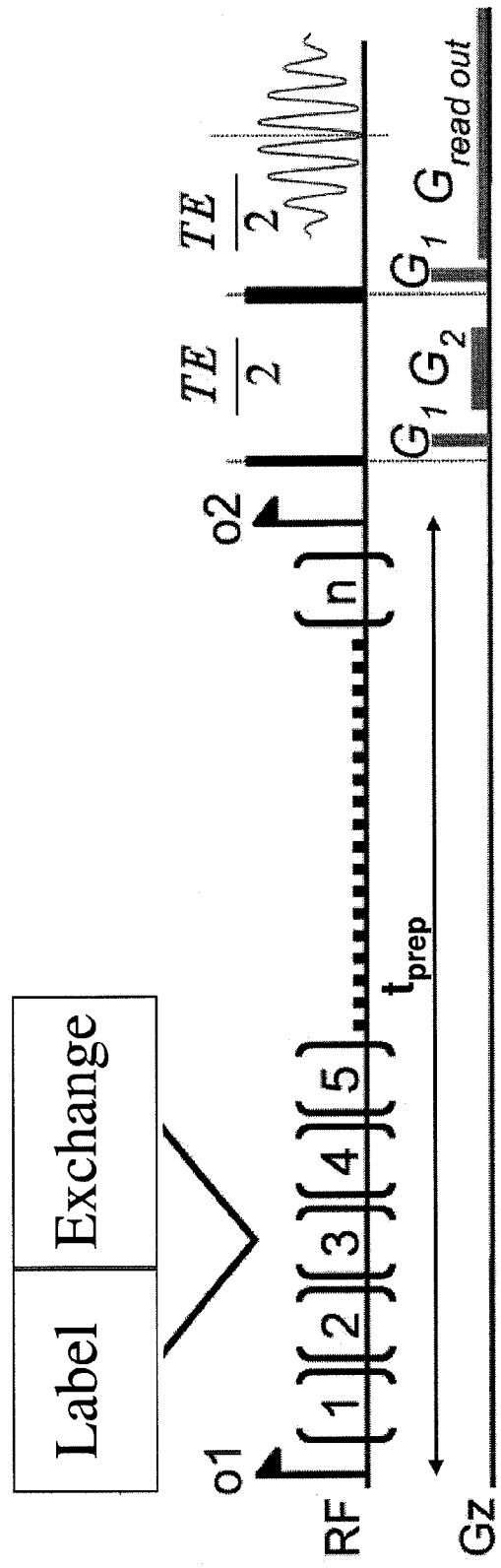
FIG. 5 is a schematic illustration of an imaging pulse sequence comprising multiple Label—exchange Transfer Modules (LTMs) according to some embodiments of the current invention.

Conventional techniques enhance sensitivity using a continuous saturation preparation pulse shown in FIG. 2 or a series of shorter higher power saturation pulses. The saturation preparation pulse is at the foundation of chemical-exchange-saturation-transfer (CEST) imaging and even embedded in its nomenclature. The conventional saturation preparation pulse in CEST imaging substantially equalizes the populations of spins in the high and low energy states. In contrast to the conventional saturation preparation pulse to label spins, some embodiments of the current invention may label the spins of exchangeable protons rapidly, substantially without saturation, and with high efficiency by using a short frequency-selective RF pulse. Depending on the frequency offset difference from the water resonance frequency, the length of this pulse may range from microseconds to milliseconds, with the requirement that excitation of bulk water protons is substantially minimized. The labeled solute protons as defined above exchange with water protons, and the process is repeated. FIG. 5 shows a schematic of an imaging pulse sequence containing a preparation segment of length $t_{prep}$ according to some embodiments of the current invention. The preparation segment comprising a series of n label-transfer modules (LTMs) corresponds to blocks 401-403 in FIG. 4. In each of the LTMs, the exchangeable solute protons are selectively labeled and subsequently transferred to water during a waiting period (i.e., an exchange time). Similar to CEST, storing magnetizations of labeled protons as longitudinal magnetization of water protons may be favored because $T_1$ of water is usually long (e.g., $T_{1w} \approx 1$-4 s) and the water proton pool is so large that the probability of a labeled and transferred solute proton going back to the solute pool is small. However, in some of the embodiments of the current invention, it may not be necessary to transfer longitudinal magnetization to water only once. Signal amplification occurs because fresh longitudinal magnetization is present for the solute protons at the start of each LTM, allowing multiple transfers of labeled solute protons to water when applying multiple LTM modules during the preparation time $t_{prep}$.

The above principle may allow several labeling types to be used, as discussed below. FIG. 6A is a schematic illustration of a frequency-selective inversion pulse within a label-transfer module (LTM) according to some embodiments of the current invention. In the inversion approach, the longitudinal magnetization transferred is of the opposite sign with respect to the equilibrium water magnetization, and, as such, twice as efficient for labeling as can be maximally achieved by conventional saturation.

Figure 6B:
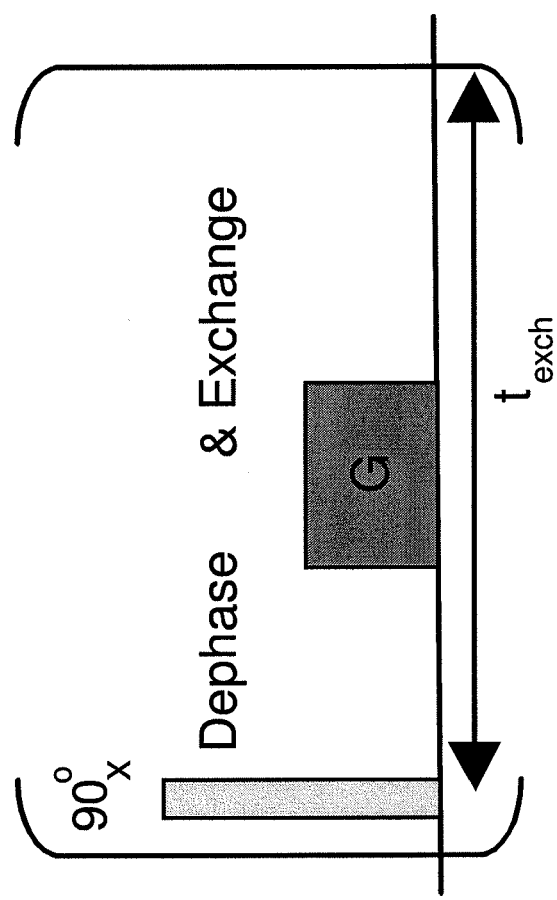
FIG. 6B is a schematic illustration of a selective excitation pulse followed by a dephasing gradient as a label-transfer module (LTM) according to some embodiments of the current invention (dephasing labeling).

FIG. 6B is a schematic illustration of a selective excitation pulse followed by a dephasing gradient within a label-transfer module (LTM) according to some embodiments of the current invention. Dephasing of transverse magnetization according to some embodiments of the current invention may seem similar to that in the MTC approach employing the short $T_2^*$ of solids. However, according to some embodiments of the current invention, protons of interest are excited selectively and the dephasing of transverse magnetization need not be relaxation-based, but can be induced coherently by a pulsed gradient. For very rapid exchange, the dephasing gradient may not be needed as substantially all spins will be transferred to water protons quickly where the magnetizations transferred to the transverse plane dephase gradually with $T_2^*$.

Although FIGS. 6A and 6B may initially appear as "saturation-like" approaches in that they may reduce the water signal intensity, the RF pulses in FIGS. 6A and 6B label the protons of interest almost instantaneously with high efficiency, which is not possible using conventional saturation.

Figure 6C:
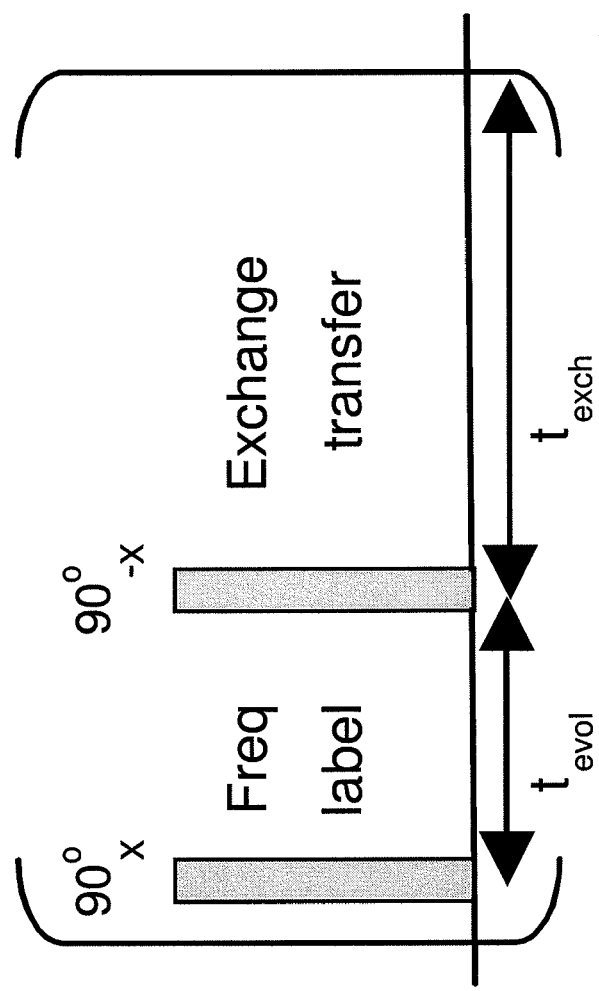
FIG. 6C is a schematic illustration of a series of RF pulses surrounding a time evolution period as label-transfer modules (LTMs) according to some embodiments of the current invention (frequency labeling).
Figure 7A:
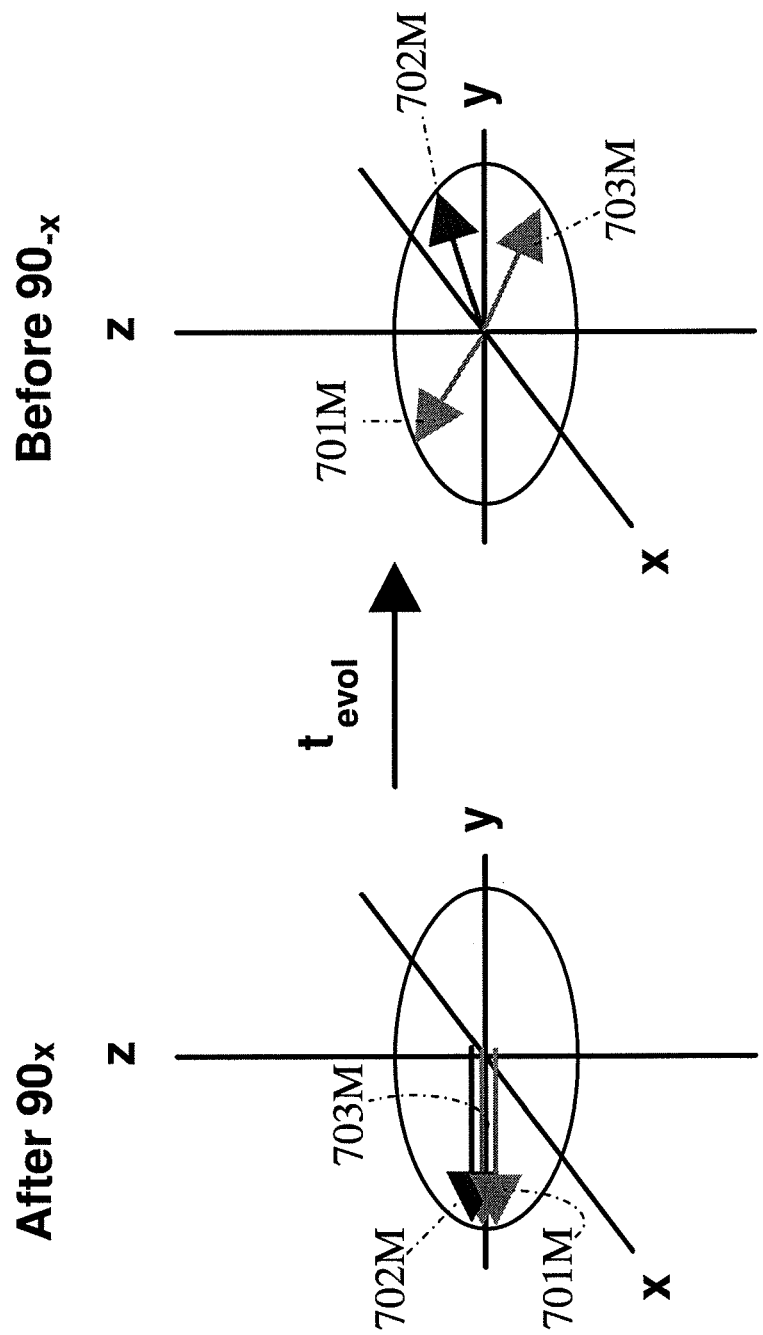
FIG. 7A illustrates the principle of frequency labeling to encode exchangeable protons with three different resonance frequencies with respect to water protons according to some embodiments of the current invention.
Figure 7B:
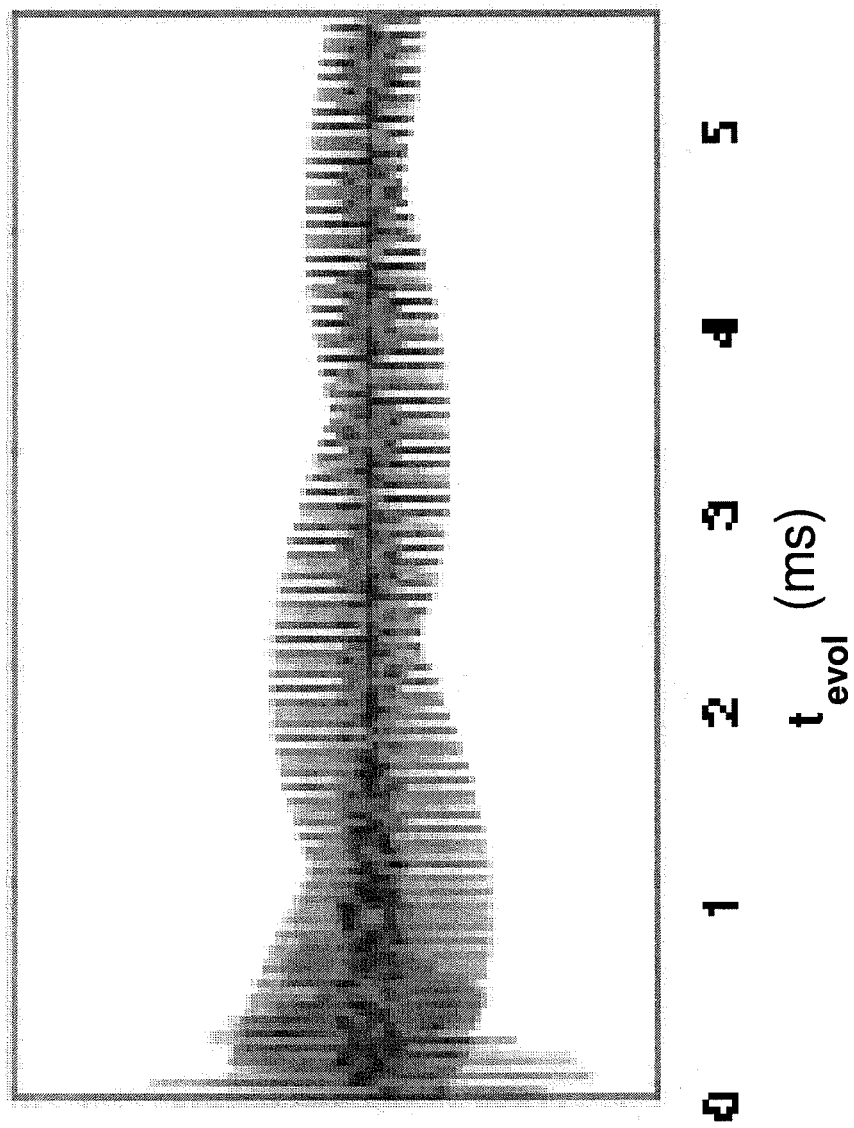
FIG. 7B shows a simulated free-induction decay signal containing the encoded frequency components of FIG. 7A according to some embodiments of the current invention.

FIG. 6C is a schematic illustration of a series of $90°_x$-$90°_{-x}$ RF pulse pairs within the label-transfer modules (LTMs) in a frequency labeled exchange transfer (FLEX) approach according to some embodiments of the current invention. The $90°_x$ and $90°_{-x}$ RF pulses in each RF pulse pair is separated by an evolution time during which the transverse magnetizations corresponding to, for example, different CEST agent protons, can rotationally evolve in time. By varying the evolution time, labeling via frequency encoding is performed. Instead of relying on saturation transfer, this approach employs amplitude modulation of the bulk water signal based on frequency information that is specific for the individual CEST agent protons, while protons from multiple CEST agents can be spectrally resolved. In the frequency labeling module of FIG. 6C, multiple exchangeable protons are excited with a frequency-selective $90°_x$ RF pulse that avoids the water resonance as much as possible. The left graph of FIG. 7A illustrates magnetization components 701M, 702M, and 703M with three different resonance frequencies, right after the selective $90°_x$ RF pulse. After that, the magnetizations of the individual protons (of different agents or on the same agent) start to evolve according to their different resonance frequencies. The right graph of FIG. 7A shows the evolution dispersion of the magnetizations of the same three frequency components after an evolution time, $t_{evol}$. Then, a $90°_{-x}$ RF pulse of opposite phase may be applied to return these magnetizations to the z-axis. However, depending on the chemical shift of the resonance frequencies of the protons, different fractions of the transverse magnetizations (i.e., components along the axis perpendicular to the axis of excitation, in this example the $\pm y$ directions) may return to the longitudinal axis. When transferred to water, the different fractions of magnetizations can lead to different amounts of signal loss, which may be amplified through the use of multiple label-exchange modules. FIG. 7B shows a simulated free-induction decay signal containing three different signal components 701S, 702S, and 703S, corresponding to magnetization components 701M, 702M, and 703M, respectively.

This approach may again look like "saturation", and at first glance, it may seem impossible to separate the components out. Separation of the components may indeed be impossible if only one evolution time is used. However, when using a series of experiments with multiple evolution times, the information of the components can be modulated and saved in a second time dimension—the evolution time. The modulated information may be combined in a single free induction decay in the second time dimension as a function of $t_{evol}$ to decode the information of the components.

Figure 7C:
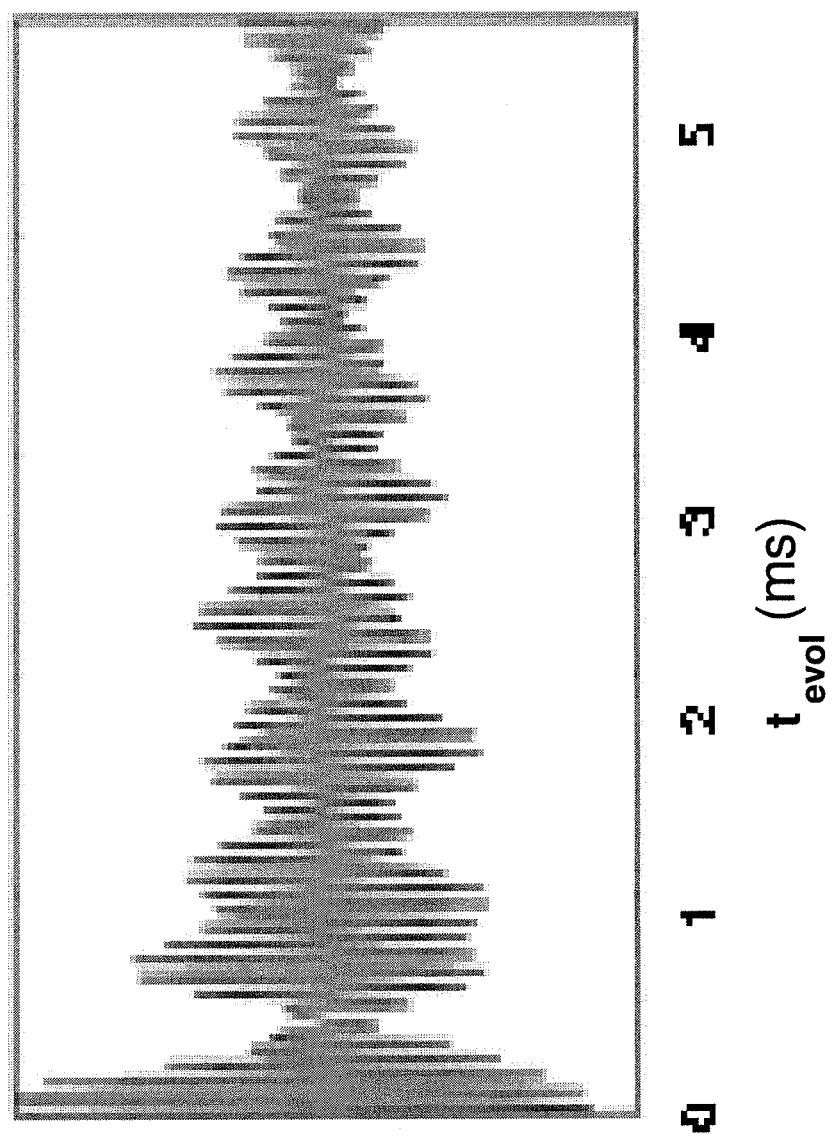
FIG. 7C shows the convoluted decay signal of FIG. 7B without color coding according to some embodiments of the current invention.

FIG. 7C shows the convoluted decay signal of FIG. 7B, indicating that substantially all signals are from water protons, but that the frequency information of the solute protons is maintained. The detailed analysis is discussed below with respect to FIGS. 8A-8D.

Figure 7D:
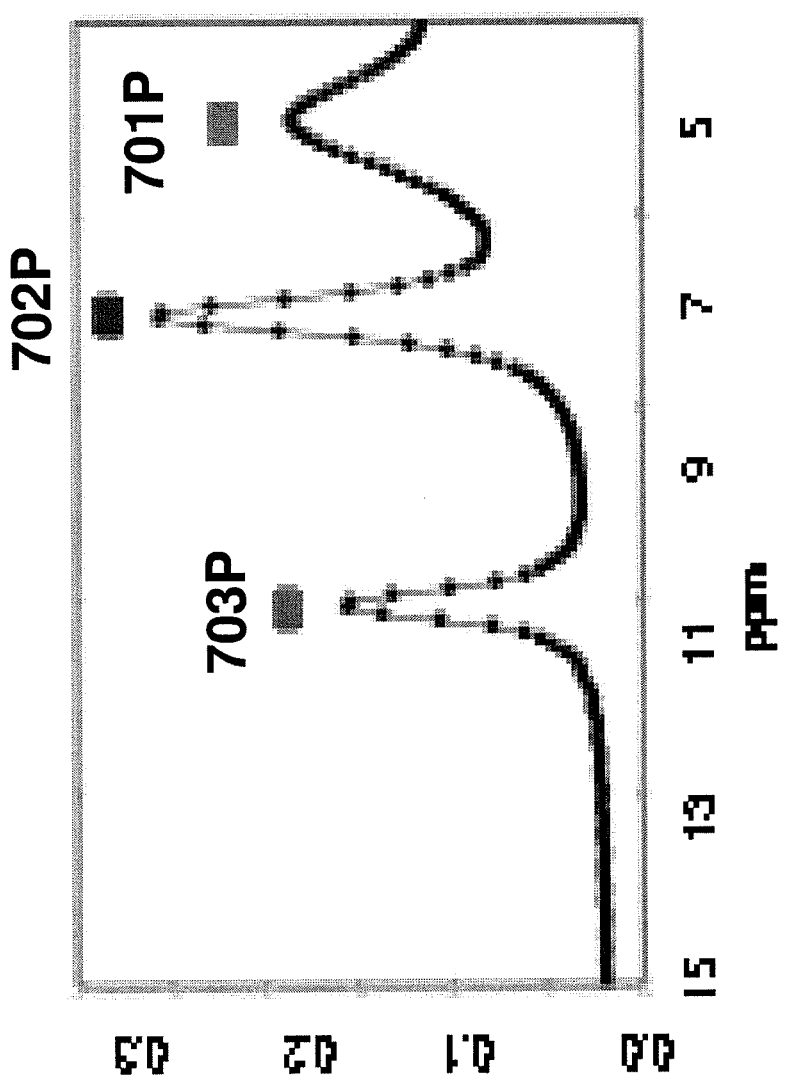
FIG. 7D shows the spectrum obtained after Fourier Transform (FT) of the decay signals of FIG. 7C according to some embodiments of the current invention, showing that the frequency components are recovered.

FIG. 7D shows the spectrum of the convoluted decay signal of FIG. 7C according to some embodiments of the current invention. The spectrum may for instance be obtained by performing a Fourier transform on the convoluted signal of FIG. 7C in the second time dimension—the evolution time or by performing a time domain analysis to calculate the spectral components. The spectrum is plotted in a chemical shift frequency domain and three peaks, namely, 701P, 702P, and 703P, corresponding to the three magnetization components of 701M, 702M, and 703M respectively, are revealed. Thus, the FLEX method according to some embodiments of the current invention is capable of spectrally resolving multiple chemical components (e.g., different species of protons, coupled nuclei, etc.) with different chemical shift frequencies.

Figure 8B:
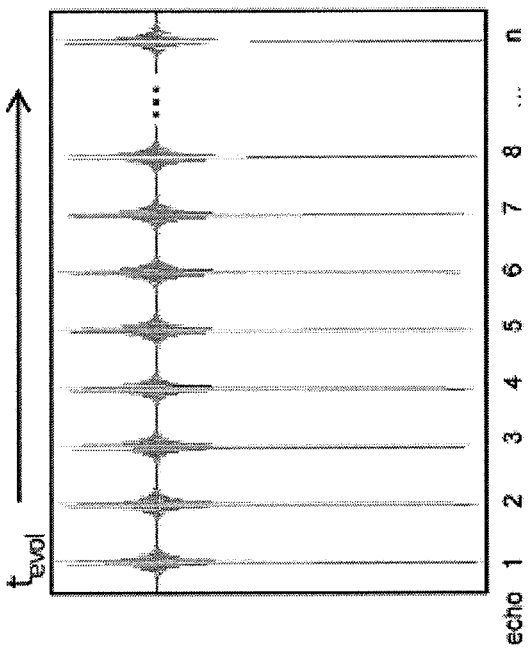
FIG. 8B shows spatial profiles after Fourier Transform of the acquired magnetic resonance response signals of FIG. 8A according to some embodiments of the current invention.
Figure 8A:
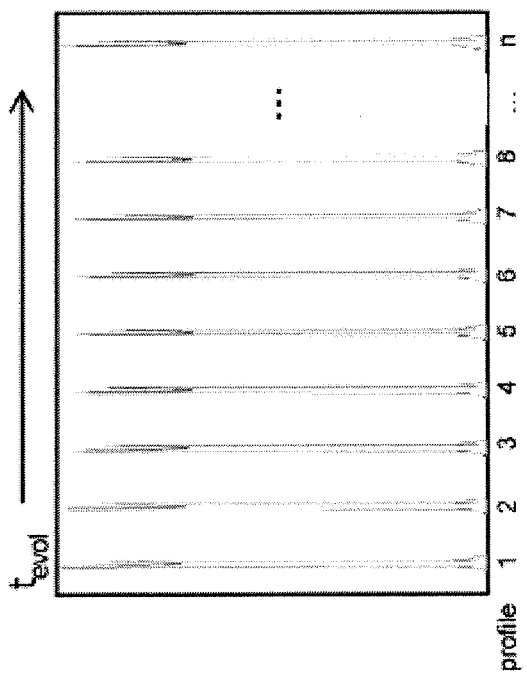
FIG. 8A shows acquired magnetic resonance response signals as a function of different evolution times in a frequency labeling approach according to some embodiments of the current invention.
Figure 8D:
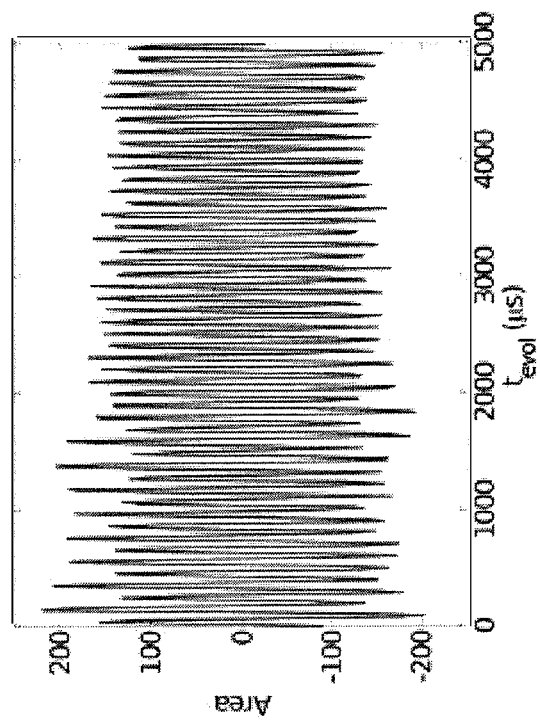
FIG. 8D shows the intensity signal of FIG. 8C with the average signal intensity subtracted to form a free induction decay (FID) signal evolution time dependence.
Figure 8C:
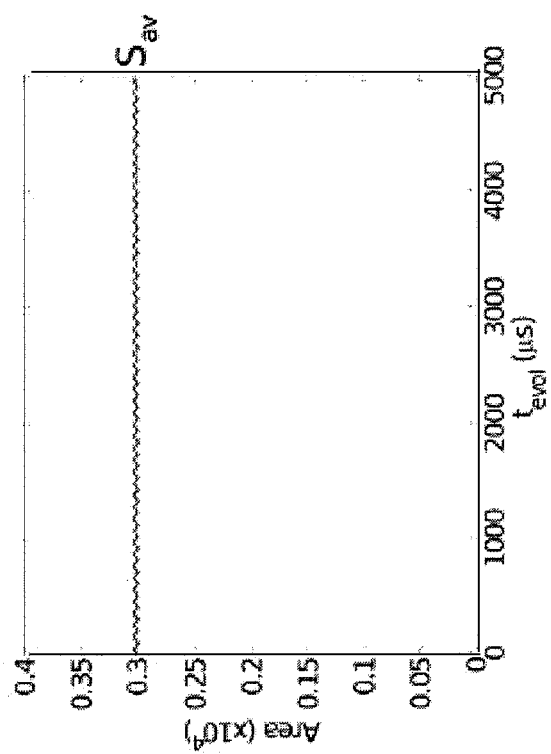
FIG. 8C shows the time dependent intensity of the water signal obtained by combining the intensities to form integrals of the individual spatial profiles of FIG. 8B.

FIG. 8A shows actual acquired magnetic resonance response signals as a function of different evolution times according to some embodiments of the current invention. FIG. 8B shows spatial profiles of the acquired magnetic resonance response signals after Fourier transforms according to some embodiments of the current invention. FIG. 8C shows a bulk water signal intensity time dependence as a function of evolution time obtained by combining the spatial profiles of FIG. 8B in a way to plot the integrals (or intensities) as a function of evolution time in a single plot. FIG. 8D shows the bulk water signal intensity variation of FIG. 8C with the average signal intensity as a function of evolution time subtracted out. Note that this stage of real data analysis corresponds to the simulated data analysis stage of FIG. 7C.

The FLEX method according to some embodiments of the current invention may enable the separation of multiple agents even after label-transfer to the single bulk water frequency, in a manner similar to multi-dimensional Fourier-Transform (FT) NMR. However, here FLEX method according to some embodiments of the current invention allows a sensitivity enhancement and detection of low-concentration solute protons of CEST agents through the MR water response signal, allowing the use of the FLEX method for clinical imaging. In addition to frequency separation, the FLEX method according to some embodiments of the current invention may allow separation of proton types through exchange filtering either by varying the length of the exchange time, or, by taking advantage of the speed of signal decay in the evolution time domain. The latter approach may have the advantage that components with broad resonance spectra, such as the solid state saturation contribution (MTC) disappear quickly as a function of evolution time and can thus be filtered out by removing the first FID points (in the microsecond range) or by separating out the components through time domain analysis of the acquired free induction decay. The ability to filter out components with broad resonance spectra may be desirable because the magnetization transfer (MT) spectrum is not totally symmetric, complicating CEST asymmetry analysis in vivo.

Specifically, quantitative analysis of conventional CEST spectra relies first and foremost on accurate centering of the water frequency before asymmetry analysis. This centering can be a tricky process because the shape of the direct water saturation component of the z-spectrum is very steep (e.g., see FIG. 3C). In vivo, the centering can become even more tricky as $B_0$ homogeneity decreases and large MTC effects as well as small endogenous CEST effects interfere with the CEST effects of exogenous agents. The FLEX method according to some embodiments of the current invention may be performed without the asymmetry analysis and may not require the centering process, as demonstrated below with respect to FIGS. 9-13.

Figure 9A:
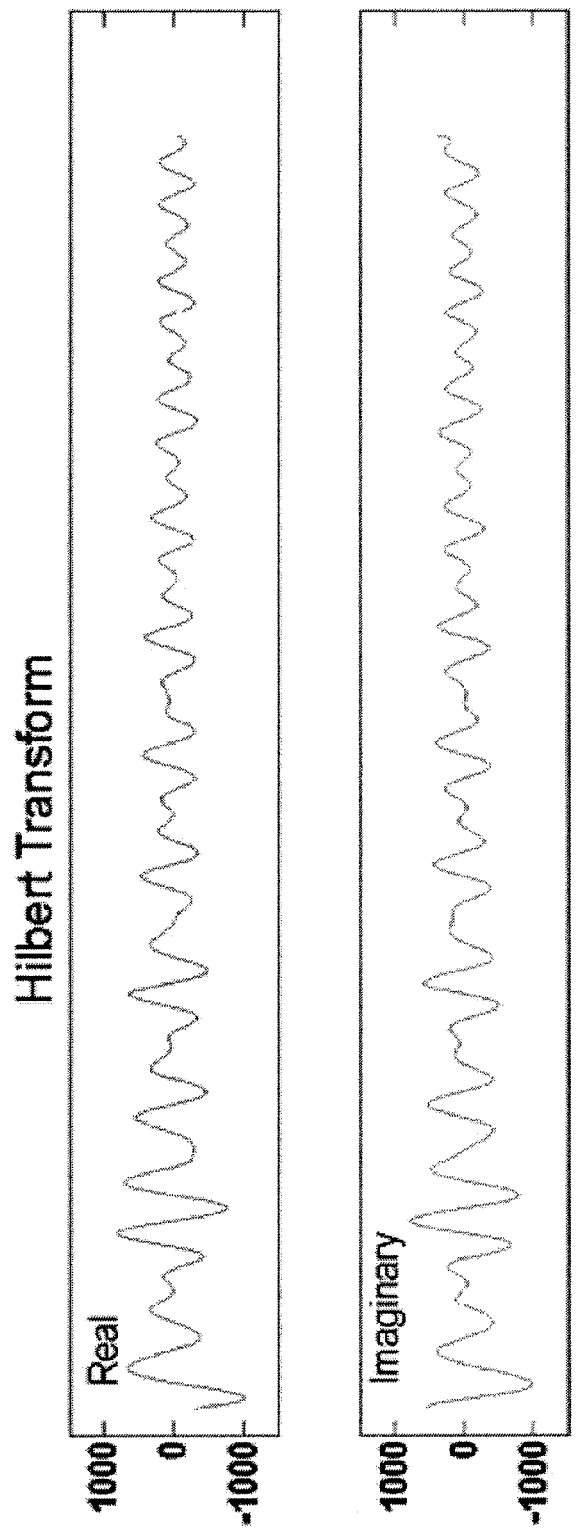
FIG. 9A shows a free induction decay signal after a Hilbert transform according to some embodiments of the current invention.
Figure 9B:
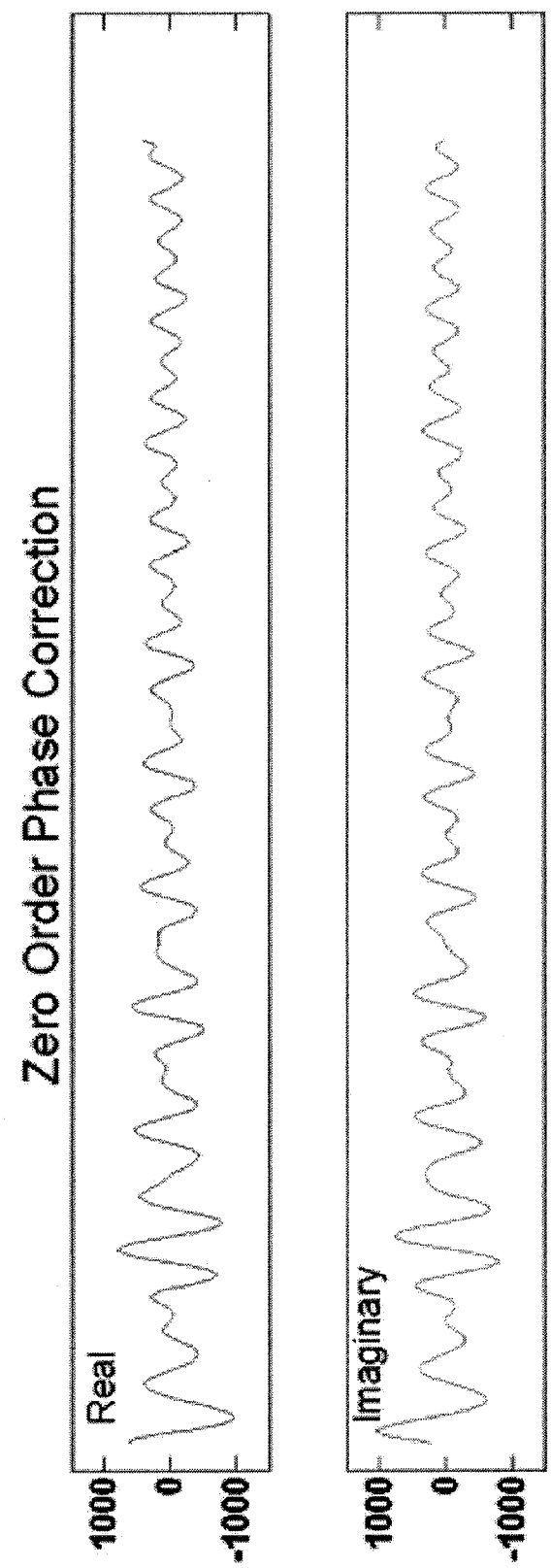
FIG. 9B shows the real and imaginary components of the Hilbert transformed free induction decay signal with phase corrections according to some embodiments of the current invention.
Figure 9C:
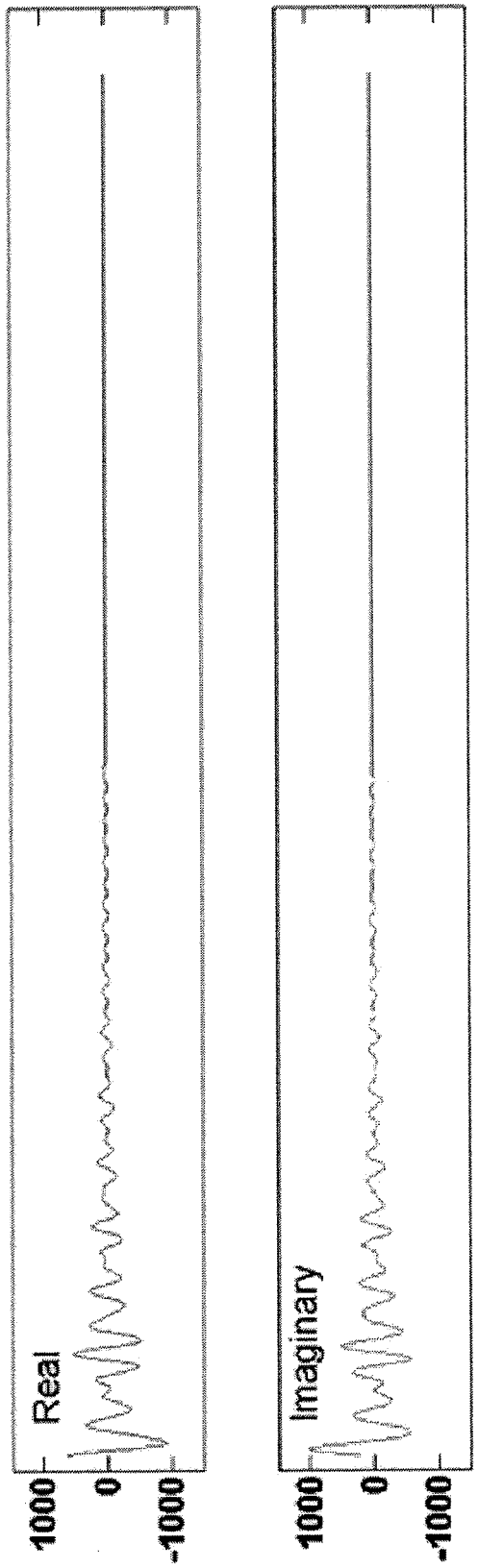
FIG. 9C shows the phase-corrected real and imaginary components after apodization and zero-filling.
Figure 9D:
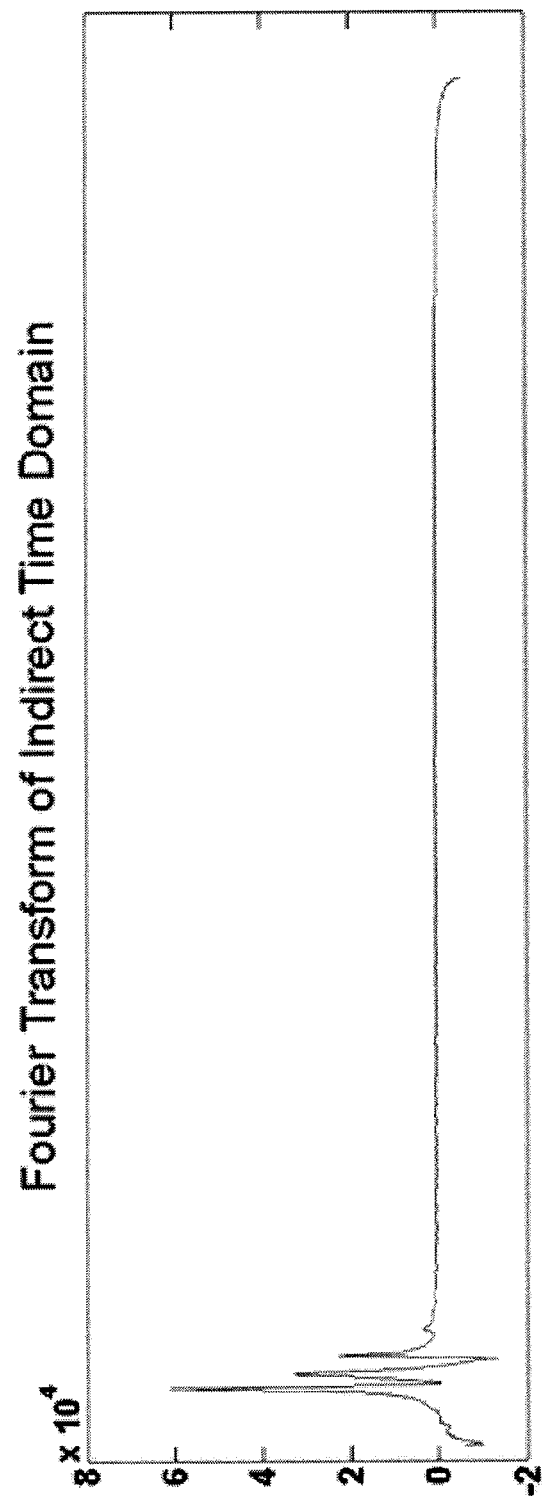
FIG. 9D shows the spectral components of the apodized and zero-filled real and imaginary components from FIG. 9C after a Fourier transform.

The time domain free induction decay can be analyzed using either frequency domain analysis or time domain analysis. An example approach for frequency domain analysis is given in FIG. 9. The free induction decay (FID) is first processed to provide real and imaginary components using a Hilbert transform, as shown in FIG. 9A. The real and imaginary components generally correspond to an analytical signal of the free induction decay. The analytical signal may also be derived from the bulk water intensity signal variation directly by varying the initial phase of the selective pulse. In FIG. 9B, the real and imaginary components from FIG. 9A are subsequently phase-corrected. In FIG. 9C, the phase-corrected real and imaginary components are apodized and zero-filled. In FIG. 9D, the apodized real and imaginary components with zero fillings are processed by a Fourier Transform (FT) to obtain the spectral components.

Figure 10A:
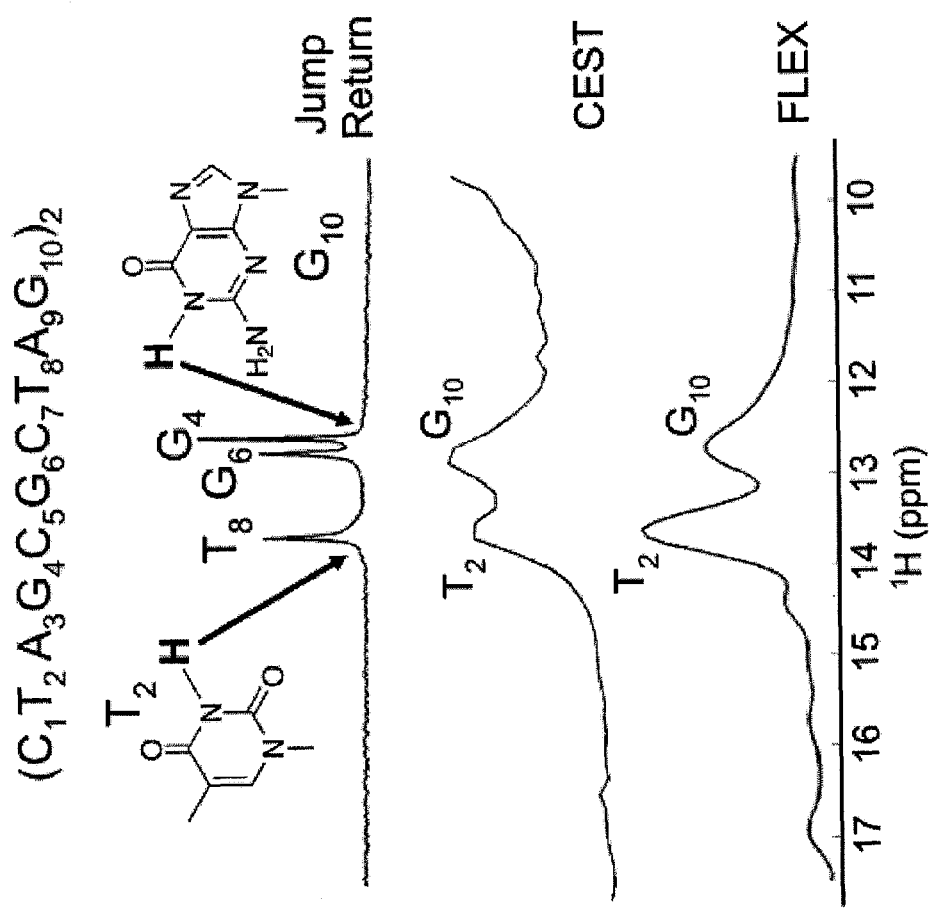
FIG. 10A illustrates a nuclear magnetic resonance (NMR) spectra of a DNA sample measured by jump return (JR), chemical-exchange-saturation-transfer (CEST), and frequency labeled exchange transfer (FLEX) according to some embodiments of the current invention.

FIG. 10A shows experimental nuclear magnetic resonance (NMR) spectra of a DNA sample measured by jump return (JR), chemical-exchange-saturation-transfer (CEST), and frequency labeled exchange transfer (FLEX) according to some embodiments of the current invention. The DNA sample measured is a 4 mM solution of a 10-base-pair palindromic DNA duplex of $(C_1T_2A_3G_4C_5G_6C_7T_8A_9G_{10})_2$. The rapidly exchanging imino protons of Thymine (T) and Guanine (G) are expected in the region from 10-16 ppm. Even though JR water suppression was used to retain exchangeable protons, only resonances of the $T_8$, $G_4$, and $G_6$ imino protons are visible, while signals for the faster exchanging $T_2$ and $G_{10}$ protons cannot be readily discerned. In contrast, the CEST and FLEX spectra show only these two imino protons, indicating the removal of other protons by the exchange rate filter that retains contributions from faster-exchange protons.

Figure 10B:
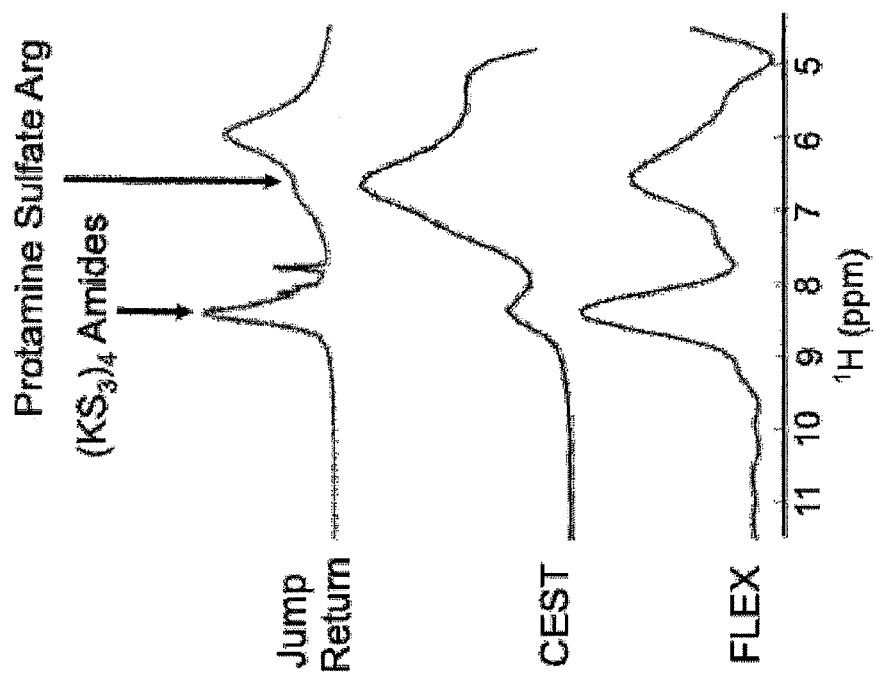
FIG. 10B illustrates a nuclear magnetic resonance (NMR) spectra of a peptide sample measured by JR, CEST, and FLEX sequences according to some embodiments of the current invention.

FIG. 10B shows a nuclear magnetic resonance (NMR) spectroscopy of a peptide sample measured by JR, CEST, and FLEX sequences according to some embodiments of the current invention. The peptide sample is a mixture of protamine sulfate (PS) and the small polypeptide $(LysSer_3)_4$. Conventional JR method can only detect the small peptide but the protamine sulfate is poorly visible. In contrast, the CEST and FLEX spectra shows both the small peptide and the protamine sulfate.

Thus, the results in FIGS. 10A and B show that the FLEX method according to some embodiments of the invention can detect protons with exchange rates faster than those that are invisible or poorly visible on conventional JR spectra. In contrast to the conventional CEST approach, no asymmetry analysis was used in the FLEX method according to some embodiments of the current invention. However, the measured intensities from the CEST and FLEX approaches differ, which will be addressed below with respect to FIGS. 11-13.

Figure 11A:
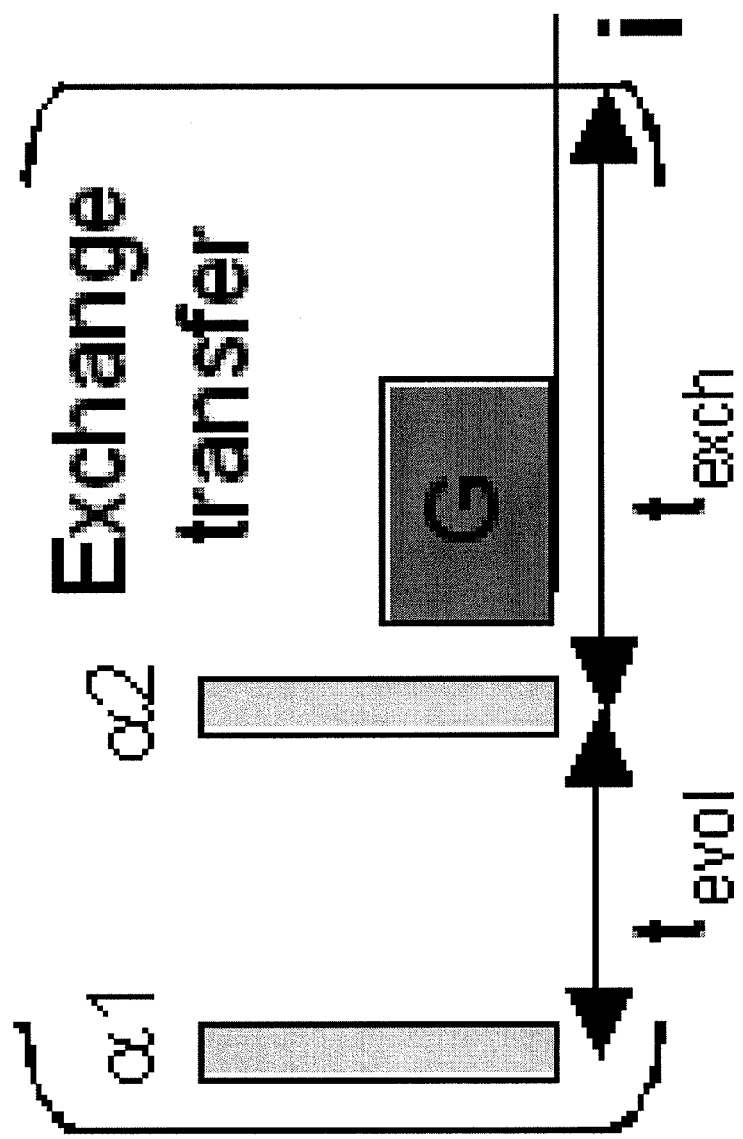
FIG. 11A illustrates a general depiction of a Label Transfer Module (LTM) for water labeling according to some embodiments of the current invention.

FIG. 11A illustrates a general LTM that may include all new labeling methods, such as inversion transfer, dephasing transfer, and frequency transfer for progressive water labeling according to some embodiments of the current invention. The progressive water labeling may be achieved using a series of these label transfer modules (LTMs) during which rapid frequency-selective solute proton labeling is followed by a period for exchange transfer, as shown in FIG. 11A. The three technologies for exchange transfer MRI proposed in FIGS. 6A-6C (inversion, dephasing, and frequency labeling) differ from conventional CEST (continuous saturation) with regard to repeated rapid frequency-selective solute proton labeling followed by transfer to bulk water protons for detection using the solvent signal.

To compare CEST and LTM-based exchange transfer, appropriate equations have been derived under the assumptions that 1) the length of the labeling module is much shorter than $T_1$s of water and the exchangeable protons, 2) the exchange rate is much faster than $1/T_1$ of the exchangeable protons, 3) there is negligible back exchange from water to agent protons, 4) solute protons are part of a two-pool model (i.e. multiple two-pool models may be allowed). These equations may apply up to exchange rates of several hundred Hertz, in line with the example below. For faster rates, the Bloch equations may need to be solved numerically, such as for another example below. The water signal attenuation (1-S/

$S_0$) can be expressed in terms of a proton transfer ratio (PTR). As an illustration, an approximate analytical solution for the PTR for the CEST approach is:

$$PTR = \frac{[\text{exchangeable proton}]}{[\text{water proton}]} \cdot \alpha \cdot k \cdot T_{1w}(1 - e^{-t_{sat}/T_{1w}}), \quad \text{Eqn. (2)}$$

and the analytical description of the PTR for the LTM-based approach is:

$$PTR = \frac{[\text{exchangeable proton}]}{[\text{water proton}]} \cdot \lambda \cdot A \cdot \quad \text{Eqn. (3)}$$
$$B \cdot C \cdot (1 - e^{-k \cdot t_{exch}}) \cdot \sum_{i=1}^{n} e^{[-1+(i-1)/n]t_{prep}/T_{1w}}.$$

Square brackets indicate concentration. $\alpha$ in Eqn. 2 and $\lambda \cdot A$ in Eqn. 3 both represent labeling efficiency. k represents exchange rate, namely the normalized single-proton solute-to-water exchange rate (i.e., $k_{sw}$ in FIG. 2A). $T_{1w}$ corresponds to longitudinal relaxation time of water. The summation term of Eqn. 3 reflects that magnetization transferred in the first LTM module may experience $T_{1w}$ decay over the full $t_{prep}$, while that transferred in the nth LTM module may hardly relax longitudinally. Parameters A, B, and C will be discussed with respect to FIG. 11B.

FIG. 11B shows the compilation of the experimental and theoretical parameters for the three LTM sequences, namely, inversion, dephasing, and frequency labeling, according to some embodiments of the current invention. $\alpha_1$ and $\alpha_2$ correspond to flip angles of RF pulses, Parameter A is a label scaling factor, while B and C describe additional weighting resulting from transverse decay and evolution of transverse magnetization during $t_{evol}$. PW correspond to the pulse width of the frequency-selective RF pulse(s) in the LTM module. Among the three LTM sequences, exchange transfer efficiency depends on k for inversion and frequency labeling, but not for dephasing, where $t_{exch}$ basically equals $t_{prep}$. This is because it is irrelevant whether dephasing occurs for magnetization of the solute protons or for transferred magnetization of the water protons.

The choice of sampling frequency during $t_{evol}$ may depend on the disappearance of the free induction decay (FID) signal after a time of $\sim 5/(k+1/T_2^*)$. For instance, for k=1000 Hz, only a few ms are available for $t_{evol}$ and, in order to have sufficient signal, a short dwell time (e.g., 25 μs) may be needed to encode the early part of the FID. This short dwell time may lead to a choice of excitation frequency far off-resonance to avoid water excitation and may lead to unfavorable excitation profiles of the RF pulse. As such, higher field strength may be more advantageous for characterizing agents with rapidly exchanging protons. Thus, the agents may be optimized for the magnetic field of the intended use, and sampling rate may be optimized depending on the field. In addition to k-space-based sampling optimization, time-domain based sparse sampling schemes may be used to minimize acquisition time. Various sampling strategies, for example, the points are selected from random, exponentially-weighted random distributions, or from a Poisson distribution may be attempted. For validation, results from various sampling strategies may be compared with those from the acquired full-range linear time-domain data.

The LTMs according to some embodiments of the current invention may employ frequency-selective RF pulses to label protons of interest by selective excitation, which is not possible in magnetization transfer contrast (MTC) because MT resonances can spread over tens of kHz. The selective excitation being utilized in the LTMs may need to be optimized to balance minimizing the perturbation of water, maximizing the excitation/labeling of the protons of interest, and minimizing signal loss due to exchange during the pulse. Different schemes may be used, depending on the exchange rate of k, the resonance frequency of the protons of interest on the agent molecule, and the field strength. For example, rectangular and shaped RF pulses may be used and their excitation profiles may be measured experimentally.

Figure 12A:
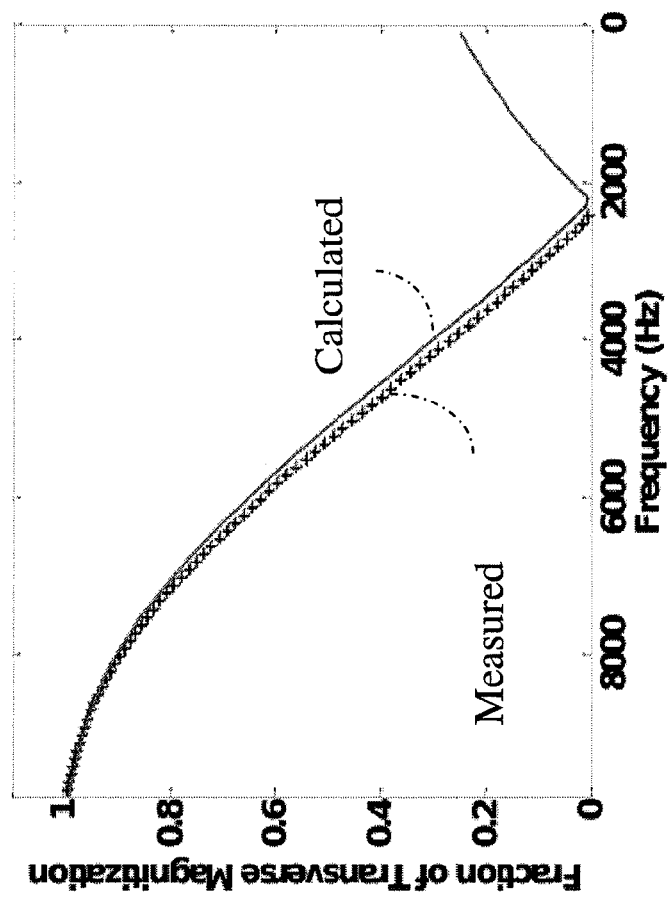
FIG. 12A shows measured and calculated excitation profiles for a 100 μs rectangular RF labeling pulse in a FLEX sequence according to some embodiments of the current invention.

FIG. 12A shows measured and calculated excitation profiles for a rectangular 100 μs RF labeling/excitation pulse in a FLEX sequence according to some embodiments of the current invention. The FLEX sequence was employed to measure DNA and peptide samples with results shown in FIGS. 10A and 10B. The measured and calculated excitation profiles in FIG. 12A match excellently, indicating that simulations can estimate the actual excitation profile reasonably well. Optimization of the calculated excitation profiles may be most difficult at low field (e.g., 3 T and 7 T) if the frequency range for the solute protons of interest is close to the water frequency, as is often the case for diamagnetic (DIACEST) and liposome-based (LIPOCEST) agents, but not for PARACEST agents. Limits on specific absorption rate (SAR) may not be a major issue for this optimization of excitation profile. In addition to optimizing the calculated excitation profile, exchange during the pulse may need to be minimized. Because of the use of short pulses with pulse widths on the order of 0.1-5 ms, exchange during the pulse for LTM-based excitation/labeling may be easily minimized, leading to a major advantage for the FLEX method according to some embodiments of the current invention. Thus, compared to conventional CEST approaches, the LTM-based approach according to some embodiments of the current invention may achieve rapid excitation of the small pool of protons of interest.

Figure 12B:
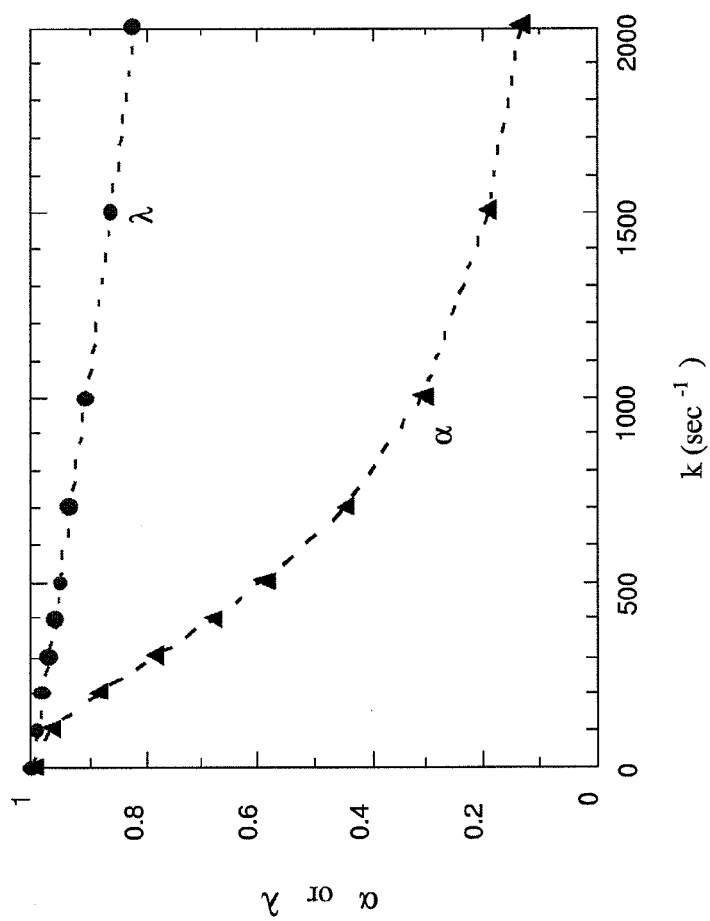
FIG. 12B shows the calculated efficiencies of saturation (a) and exchange transfer (X) as a function of exchange rate using an inversion labeling LTM module.

The saturation/labeling efficiency $\alpha$ in Eqn. 2 of CEST may reduce strongly with increasing exchange rate. The excitation/labeling efficiency $\lambda$ in Eqn. 3, on the contrary, may have limited dependency on the exchange rate. To predict the effect of the exchange rate, simulations were performed using the Bloch equation to calculate $\alpha$ of a conventional CEST approach and $\lambda$ of an LTM-based inversion labeling experiment. FIG. 12B shows the calculated saturation efficiency $\alpha$ and labeling efficiency X, of LTM-based labeling (using an inversion pulse according to FIG. 6B) as a function of exchange rate. The LTM approach according to some embodiments of the current invention may work better for protons with high exchange rates. The parameters used in the calculation are: ratio of solute protons to water protons at 1:10,000, $T_1$ of solute at 2 s, $T_1$ of water at 5.0 s, $T_2$ of solute at 200 ms, $T_2$ of water at 500 ms, $B_1$ of the CEST pulse at 2 μT with a saturation time of 5 s, $B_1$ of the inversion pulse at 10 μT (with a pulse width of 200 μs and n=1000), exchange time ($t_{each}$)/transfer rate (k) pair at 12 ms/100 Hz, 8.5 ms/200 Hz, 6.7 ms/300 Hz, 5.6 ms/400 Hz, 4.8 ms/500 Hz, 3.8 ms/700 Hz, 3 ms/1000 Hz, 2.2 ms/1500 Hz, and 1.8 ms/2000 Hz.

In addition, the exchange transfer efficiency $(1-\exp^{-kt_{exch}})$ in Eqn. 3 increases with exchange rate, leading for variable proton transfer ratio (PTR) for LTM-based measurements depending on the exchange rate k the exchange time $t_{exch}$. Compared to CEST, the period $t_{exch}$ can be used as an exchange filter. For instance, for rapidly exchanging protons (e.g. k>2000 s$^{-1}$), an 86% efficiency of transfer may be achieved with an exchange time of 1 ms and the efficiency may improve to 98% at an exchange-time of 2 ms. For protons with slower exchange rates (e.g. k of about 20 s$^{-1}$), these efficiencies would be 2.0% and 3.9%, respectively. To the best of the inventors' knowledge, such exchange rate filtering has not yet been applied to CEST agents. The design of CEST contrast agents allows specification of the exchange rate range based on the molecular building blocks used, which may in the future be based on the capabilities of some of the embodiments proposed in the current invention.

Figure 12C:
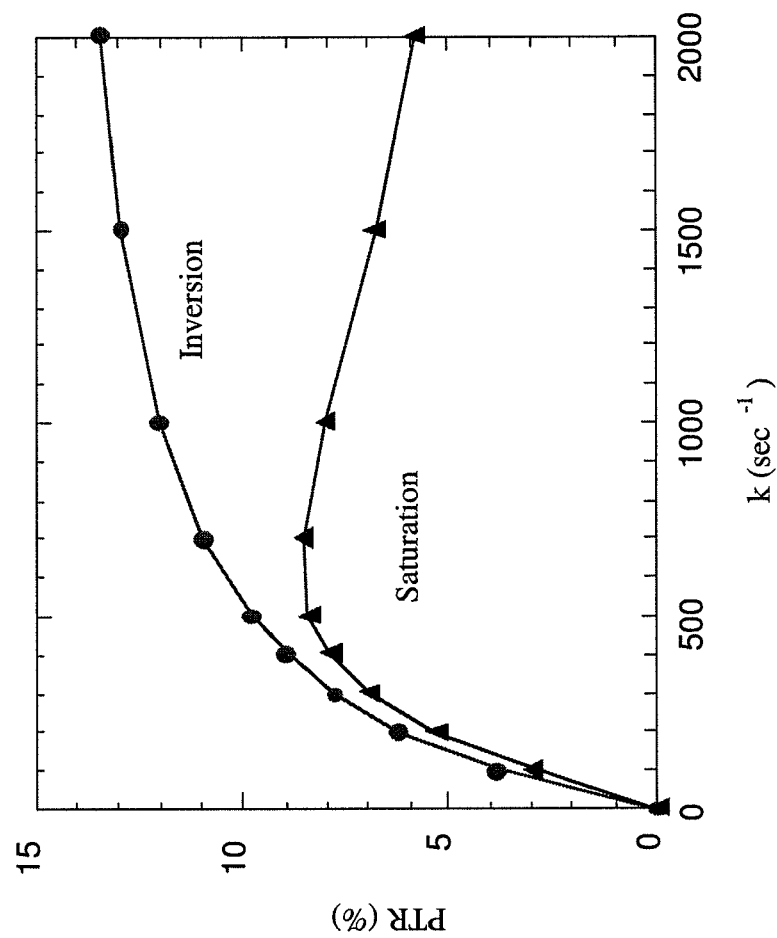
FIG. 12C compares the calculated proton transfer ratio (PTR) as a function of exchange rate using conventional saturation and LTM-based inversion labeling pulses.

FIG. 12C shows the calculated proton transfer ratio (PTR) as a function of exchange rate using conventional saturation labeling pulse and LTM-based inversion labeling pulse. At higher exchange rates, the inversion labeling pulse used in a LTM-based approach according to some embodiments of the current invention exhibits higher PTR than a convention saturation pulse used in current CEST approaches.

A full derivation of the analytical solution of the Bloch equations describing the LTM-based exchange transfer may account for exchange losses during the RF pulses and for back-exchange effects in case the concentration of transferred and labeled protons in the water proton pool becomes too high. The validity range of the analytical solution may be established through comparison with numerical solution of the Bloch equations for LTM modules with different exchange time $t_{exch}$, evolution time $t_{evol}$, preparation times $t_{prep}$, and number of LTMs, n. The validity range may also be established through comparison with quantitative measurements of k and $T_{1w}$ using LTM-based approaches on phantoms having agents with exchangeable protons.

Phantom spectroscopy experiments may suffer from radiation damping because acquisition of the overwhelmingly large water signal can lead to faster stimulated recovery of the longitudinal magnetization of M. Such radiation damping may be avoided by using a readout gradient, even for phantoms such as NMR tubes. For the inversion and frequency labeling approaches shown in FIGS. 6A and 6C, a gradient during the exchange period may be further applied to dephase any unintended large transverse water component. In addition, radiation damping may not be an issue in vivo.

Water, with a proton concentration of 110M, can be used as a concentration reference standard for exchange transfer measurements. The PTR can be directly related to the water signal loss through:

$$1 - S_{transfer}/S_0 = \sum_S PTR_S. \qquad \text{Eqn. (4)}$$

Figure 13A:
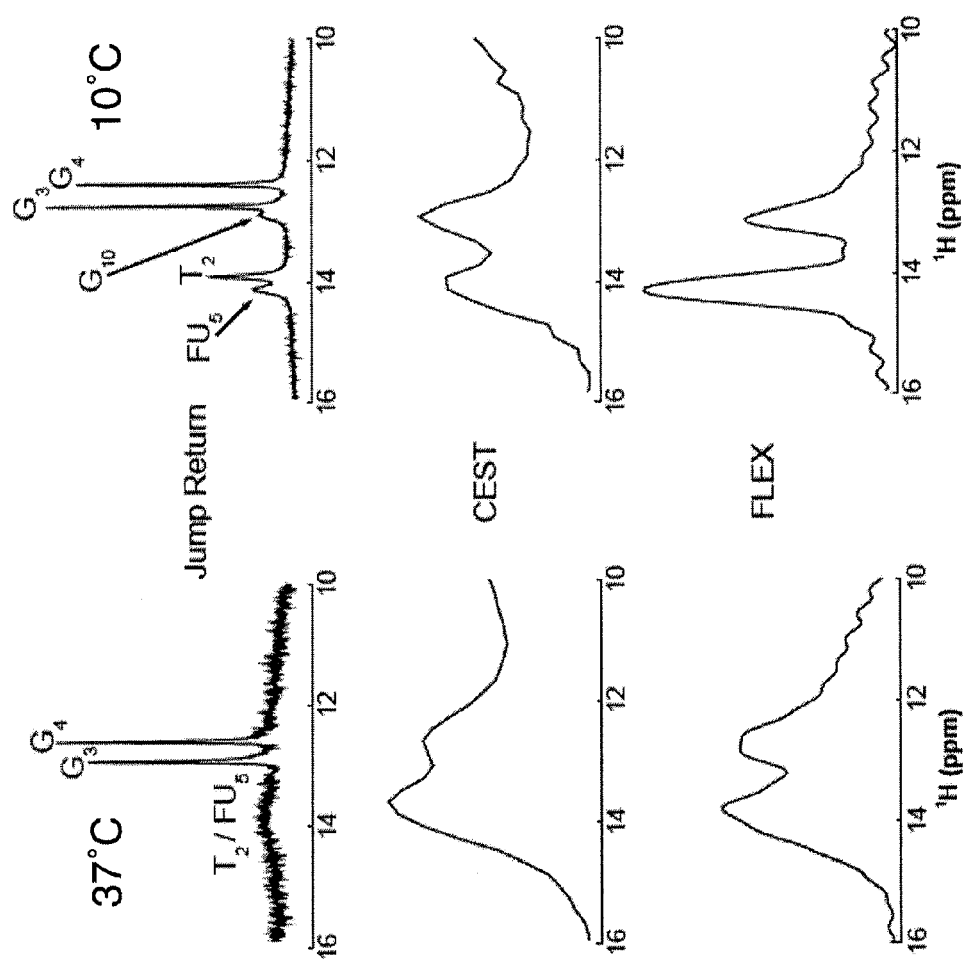
FIG. 13A shows NMR spectra of a DNA duplex sample measured by J R, CEST, and FLEX sequences at 37° C. (left) and 10° C. (right).
Figure 13B:
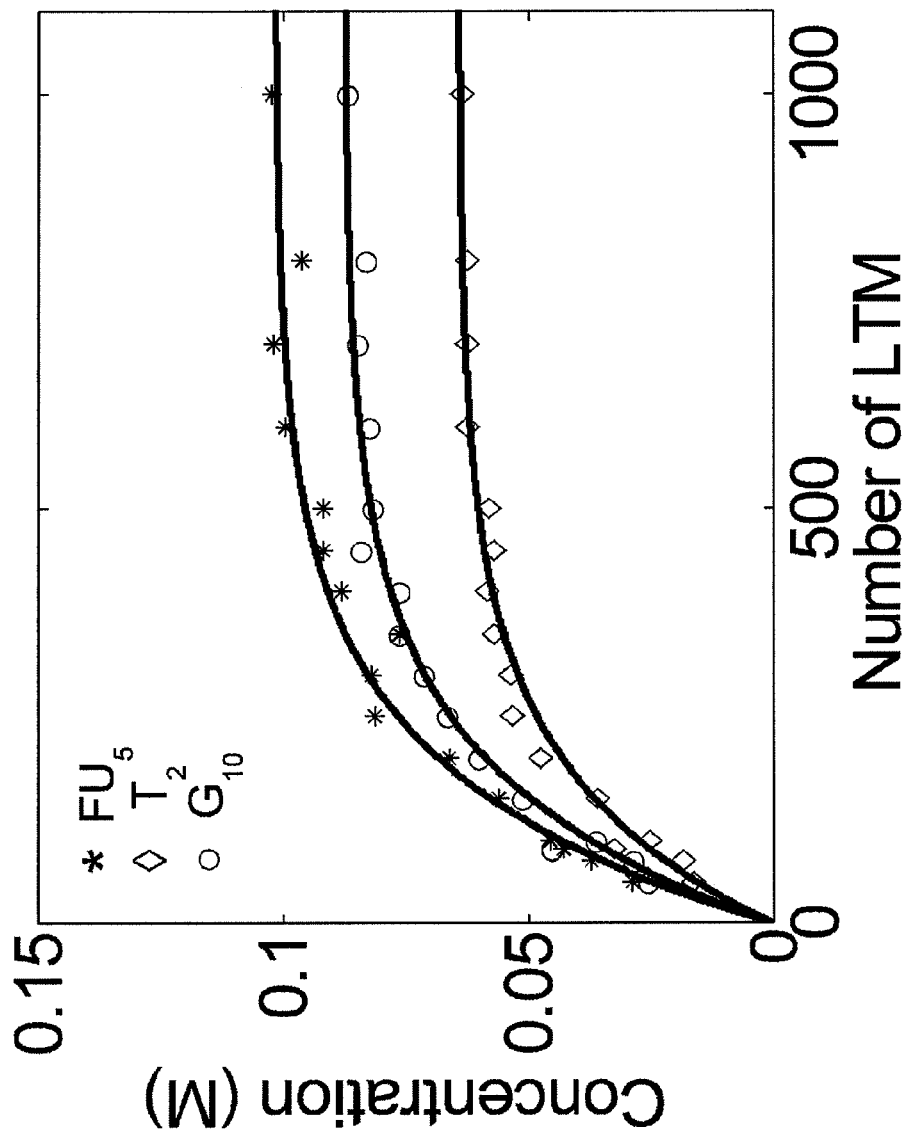
FIG. 13B shows the concentration of labeled protons generated by the FLEX sequence used in FIG. 11A (from data at 10° C.) as a function of the number of label-transfer modules (LTMs).

$S_{transfer}$, $S_0$ represent water MR signals with and without exchange transfer. The summation is over the contributions of all exchangeable protons excited or saturated with the preparation pulse. When using the water proton concentration (110M) for $S_0$, the total effect size is well calibrated and, if a single solute proton species dominates or if the contributions of different solute proton species can be separated out as shown below, the concentration of the solute proton species can be determined when the exchange rate and the labeling efficiencies are known according to Eqn. 3. FIG. 13A shows the NMR spectroscopy of a DNA duplex sample measured by JR, CEST, and FLEX sequences at 37° C. (left) and 10° C. (right). The DNA duplex sample is 5'-$C_1T_2G_3G_4FU_5C_7C_8A_9G_{10}$-3'. In the JR spectrum at 10° C., all imino protons are visible. However, in the CEST and FLEX spectra, $G_3$ and $G_4$ are not visible. FIG. 13B shows the apparent concentration of labeled protons generated based on the FLEX sequence as a function of the number of label-transfer modules (LTMs), according to some embodiments of the current invention. The apparent concentration is the concentration of water protons scaled by the proton transfer ratio (i.e., PTR•110M). FIG. 13C shows the measured frequency shift, exchange rate, exchange efficiency, labeling efficiency, and concentration for three imino protons, namely fluorouracil (FU$_5$), $T_2$, and $G_{10}$, as obtained from time domain fitting of the FLEX data. The results demonstrate an excellent correspondence between the experimental curves and our theoretical predictions. Exchange rates were determined directly from fitted line widths (LW) (k+1/$T_2^*$=π·LW) in the JR spectrum at the temperature of 10° C. After determining the excitation profile of the FLEX 90°-90° pulse sequence to obtain labeling efficiency λ for the different protons, the proton concentrations were calculated. The calculated proton concentrations were substantially equal as expected. As the molecule is a dimer, the measured DNA concentration is ½ the measured proton concentration, namely 0.60-0.65 mM, in reasonable correspondence to the experimentally estimated concentration 0.8 mM based on independent nucleoside analysis. This reasonable correspondence provides further validation of the FLEX method according to some embodiments of the current invention.

Concentration determination in the FLEX method according to some embodiments of the current invention may incorporate knowledge of labeling and exchange transfer efficiencies and consequently knowledge of k and $T_{1w}$. $T_{1w}$ may be measured using inversion recovery. In phantoms, care will be taken to avoid radiation damping during the inversion time. k may be determined by, for example, the QUEST or QUESP methods (McMahon, M. T., Gilad, A. A., Zhou, J., Sun, P. Z., Bulte, J. W. & van Zijl, P. C. Quantifying exchange rates in chemical exchange saturation transfer agents using the saturation time and saturation power dependencies of the magnetization transfer effect on the magnetic resonance imaging signal (QUEST and QUESP): PH calibration for poly-L-lysine and a starburst dendrimer. *Magn Reson Med* 55, 836-847 (2006)), or by using the line width in the frequency spectrum of the FLEX method according to some embodiments of the current invention. For conventional CEST approaches, however, the saturation efficiency factor depends on $B_1$ power and, in addition to k and $T_{1w}$, on the exchangeable proton fraction $T_{1s}$ and on the transverse relaxation times for the both the agent protons and water as expressed below:

$$\alpha = (\gamma B_1)^2 / [(\gamma B_1)^2 + p \cdot q], \qquad \text{Eqn. (5)}$$

wherein $p = R_{2s} + k - k^2 \cdot x_s/(R_{2w} + k \cdot x_s)$, $q = R_{1s} + k - k^2 \cdot x_s/(R_{1w} + k \cdot x_s)$, $R_i = 1/T_i$ and $x_s = $[exchangeable proton]/[water proton]. Thus, concentration determination according to conventional CEST methods is more complicated than the FLEX method as discussed above.

For the analysis and quantification of magnetic resonance (MR) signals from inversion transfer and dephasing transfer according to some embodiments of the invention, a z-spectrum, similar to that used in CEST approaches, may need to be acquired to have a proper reference for data asymmetry analysis with respect to the water frequency center. However, when using CEST agents or endogeneous CEST compounds in vivo, for a single compound with an exchange rate much faster than competing in vivo mechanisms (e.g., amide proton transfer and magnetization transfer contrast), a three-point (left, right, and water) or even two-point (left-right) analysis may be sufficient.

A major complication for conventional MTC and CEST approaches is that the MTC effect is not exactly symmetric with respect to the water resonance. Thus even asymmetry analysis will not correct for this. The FLEX method according to some embodiments of the current invention may minimize the interference by MTC asymmetry through the inherent removal of the rapidly decaying MTC component due to its short $T_2^*$.

CEST compounds differ from solids or semisolids in the proton transverse relaxation properties and average exchange rate. This difference allows magnetic labeling approaches capable of separating exchange transfer effects of CEST compounds from MTC effects. These magnetic labeling approaches may allow the simultaneous detection of multiple frequencies and the use of a powerful array of multi-dimensional Fourier transform NMR methods for the detection, analysis and quantification of CEST compounds. These magnetic labeling approaches may expand the applicability of the CEST compounds in the investigation of biomedical problems and consequently increase the use of CEST compounds in the clinic. Subsequent analysis of the magnetic resonance signals obtained according to the magnetic labeling approaches may include, for example, time domain analysis, exchange rate filtering, etc.

For MR signals from the FLEX method according to some embodiments of the current invention, the FLEX spectrum may provide direct determination of proton transfer ratio (PTR) for the specific spectral lines corresponding to protons of interest. Solute protons from multiple compounds, even though detected through one pool of water protons, can still be separated out in the chemical-shift spectrum according to the FLEX method. Consequently, the complete arsenal of techniques for analyzing free induction decay (FID) signals may be applicable, including deconvolution techniques such as, for example, line-broadening, Lorentzian-Gaussian devonvolution, deconvolution-difference to remove broad components, and especially time-domain deconvolution analysis. The time domain analysis may be especially suitable because the presence of only a limited number of components with known frequencies in the FID may allow straightforward interpretation.

As the FLEX method according to some embodiments of the invention results in a free induction decay (FID), the use of modern NMR approaches such as non-uniform sampling (NUS) to accelerate the data acquisition may also be possible.

The FLEX method according to some embodiments of the current invention may provide the sensitivity enhancement needed for low-concentration agents (by detection of the combined effect of multiple labels on water signal intensity) as well as the frequency separation used in multi-dimensional NMR.

The FLEX method has reduced sensitivity to magnetic field inhomogeneities ($B_1$ and $B_0$) when compared to saturation transfer MRI because no asymmetry analysis is used in the data processing.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method for magnetic resonance (MR) imaging or spectroscopy, comprising:
   (a) selectively exciting exchangeable solute protons or protons of exchangeable solute-based water molecules within a frequency range in a subject using at least one frequency-selective radio frequency (RF) pulse,
   wherein said frequency range encompasses characteristic resonance frequencies of the exchangeable solute protons or protons of exchangeable solute-based water molecules, wherein said frequency range is substantially non-overlapping with a characteristic resonance frequency of bulk water protons in said subject,
   wherein said at least one frequency selective RF pulse performs a substantially minimal excitation on said bulk water protons, and
   wherein said at least one frequency-selective RF pulse, in combination with a time period that separates said at least one frequency-selective RF pulse, magnetically labels said exchangeable solute protons or said exchangeable solute-based water molecules;
   (b) allowing a portion of the magnetically labeled exchangeable solute protons to exchange with said bulk water protons or allowing the magnetically labeled exchangeable solute-based water molecules to exchange with bulk water molecules;
   (c) repeating (a) and (b) a plurality of times to enhance a population size of the magnetically labeled exchangeable solute protons or the magnetically labeled exchangeable solute-based water molecules;
   (d) irradiating said subject under observation with a water excitation RF pulse that is adapted to excite said hulk water protons;
   (e) recording a magnetic resonance (MR) signal from said subject under observation in response to said water excitation RF pulse; and (f) analyzing the recorded MR signal to estimate a quantity associated with said exchangeable solute protons or said exchangeable solute-based water molecules.

2. The method of claim 1, wherein said solute protons are from at least one low-concentration endogenous or exogenous compound, wherein the solute protons from the at least one low-concentration compound are at a concentration that is less than about 50% of the a concentration of said bulk water protons.

3. The method of claim 1, further comprising:
   varying an exchange time to adjust the portion of said magnetically labeled exchangeable protons or protons of said exchangeable solute-based water molecules that exchange with said bulk water protons,
   wherein said exchange time is between said at least one frequency-selective RF pulse and a repetition of said at least one frequency-selective RF pulse or between a last frequency-selective RF pulse of said at least one frequency-selective RF pulse and said bulk water excitation RF pulse.

4. The method of claim 3,
   wherein the exchanged portion depends on an exchange rate associated with said exchangeable solute protons or said exchangeable solute-based water molecules; and
   wherein said exchange time is substantially optimized to enhance a detectable effect of the magnetically labeled exchangeable solute protons or the magnetically labeled exchangeable solute-based water molecules.

5. The method of claim 1, wherein said at least one frequency-selective RF pulse comprises one of a 180-degree inversion pulse, a 90-degree excitation pulse, a train of RF pulses, or a combination thereof.

6. The method of claim 5, Wherein the 90-degree excitation pulse is followed by a dephasing gradient pulse.

7. The method of claim 5, wherein said train of RF pulses comprises a series of 90-degree excitation pulse pairs with opposite phase signs.

8. The method of claim 7, wherein each of said 90 degree excitation pulse pairs is separated in time by an evolution time.

9. The method of claim 8, wherein said evolution time is variable between successive recordings of said MR signal from said subject under observation in response to said water excitation RF pulse.

10. The method of claim 9, where the evolution time varies uniformly or non-uniformly between the successive recordings.

11. The method of claim 8, wherein said analyzing comprises:
performing a first Fourier transform on the recorded MR signal to obtain a spatial profile signal;
measuring a magnitude of said spatial profile signal to provide a bulk water signal intensity variation as a function of said evolution time; and
estimating, from said hulk water signal intensity variation, said quantity associated with said exchangeable solute protons or protons of exchangeable solute-based water molecules.

12. The method of claim 11, further comprising:
subtracting, from said bulk water signal intensity variation at each evolution time, a magnitude average of substantially all spatial profile signals over substantially all evolution times to derive a free induction decay signal representing a convolved signal of said exchangeable solute protons or protons of exchangeable solute-based water molecules; and estimating, from said free induction decay signal, said quantity associated with said exchangeable solute protons or protons of exchangeable solute-based water molecules.

13. The method of claim 12, further comprising:
removing one or more samples in said bulk water signal intensity variation or said free induction decay signal to filter out contributions from a magnetization transfer contrast (MTC) effect or residual direct bulk water saturation effects.

14. The method of claim 12, wherein said estimating comprises:
generating a real component and an imaginary component for said bulk water signal intensity variation or said free induction decay signal;
performing a phase correction for the real and imaginary components;
performing a second Fourier transform, based on the phase-corrected real and imaginary components, to obtain spectral components.

15. The method of claim 14, wherein said generating comprises:
performing a transform on said bulk water signal intensity variation or said free induction decay signal to derive an analytic signal comprising the real and imaginary components, said transform being a Hilbert transform or an equivalent thereof.

16. The method of claim 14, wherein performing the second Fourier transform yields information representing a quantity related to said exchangeable solute protons or protons of exchangeable solute-based water molecules.

17. The method of claim 16, wherein said quantity encodes a concentration of said exchangeable solute protons or protons of exchangeable solute-based water molecules.

18. The method of claim 12, wherein said estimating further comprises:
performing a time domain analysis on the said bulk water signal intensity variation or the free induction decay signal to yield information representing a quantity related to said exchangeable solute protons or protons of exchangeable solute-based water molecules.

19. The method of claim 18, wherein said quantity encodes a concentration of said exchangeable solute protons or protons of exchangeable water molecules in the solute.

20. The method of claim 1, wherein said analyzing further comprises:
performing an asymmetry analysis by comparing a spectral dependence of the recorded MR signal from said subject under observation with another spectral dependence of pre-recorded MR signals from the subject substantially without said exchangeable solute protons or said exchangeable solute-based water molecules,
wherein said comparing is performed at frequency ranges equidistant from but on opposite sides of the characteristic resonance frequency of bulk water protons.

21. The method of claim 20, wherein said asymmetry analysis yields information representing a quantity related to said exchangeable solute protons or protons of exchangeable solute-based water molecules.

22. The method of claim 21, wherein said quantity encodes a concentration of said exchangeable solute protons or protons of exchangeable solute-based water molecules.

23. An magnetic resonance imaging (MRI) system, comprising:
a magnet constructed to provide a substantially uniform main magnetic field for a subject under observation;
a radio frequency (RF) coil system constructed to selectively excite exchangeable solute protons or protons of exchangeable solute-based water molecules with in a frequency range in said subject using at least one frequency-selective radio frequency (RF) pulse,
wherein said frequency range encompasses characteristic resonance frequencies of the exchangeable solute protons or protons of exchangeable solute-based water molecules,
wherein said frequency range is substantially non-overlapping with a characteristic resonance frequency of bulk water protons in said subject, wherein said at least one frequency-selective RF pulse per a substantially minimal excitation on said bulk water protons, and
wherein said at least one frequency-selective RF pulse, in combination with a time period that separates said at least one frequency-selective RF pulse, magnetically labels said exchangeable solute protons or said exchangeable solute-based water molecules;
irradiate said subject under observation with a water excitation RF pulse to excite said bulk water protons;
record a magnetic resonance (MR) signal from said subject under observation in response to said bulk water excitation RF pulse; and
a signal processing unit, in communication with said RF coil system, configured to analyze the recorded MR signal to estimate a quantity associated with said exchangeable solute protons or protons of exchangeable solute-based water molecules.

24. The MRI system of claim 23, further comprising:
a gradient coil system configured to provide a perturbation of the main magnetic field using a gradient pulse sequence that causes said MR response signal to encode spatial information of said object under observation.

25. The MRJ system of claim 23, wherein said subject is one of a sample, a phantom, an animal subject, a human subject, or a combination thereof.

* * * * *